(12) United States Patent
Satpathy et al.

(10) Patent No.: US 8,255,610 B2
(45) Date of Patent: Aug. 28, 2012

(54) CROSSBAR CIRCUITRY FOR APPLYING A PRE-SELECTION PRIOR TO ARBITRATION BETWEEN TRANSMISSION REQUESTS AND METHOD OF OPERATION OF SUCH CROSSBAR CIRCUITRY

(75) Inventors: Sudhir Kumar Satpathy, Ann Arbor, MI (US); David Theodore Blaauw, Ann Arbor, MI (US); Trevor Nigel Mudge, Ann Arbor, MI (US); Dennis Michael Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/137,487

(22) Filed: Aug. 19, 2011

(65) Prior Publication Data
US 2012/0047310 A1    Feb. 23, 2012

Related U.S. Application Data

(63) Continuation-in-part of application No. 12/926,462, filed on Nov. 18, 2010, which is a continuation-in-part of application No. 12/458,511, filed on Jul. 14, 2009, which is a continuation-in-part of application No. 12/379,191, filed on Feb. 13, 2009, now Pat. No. 8,108,585.

(51) Int. Cl.
*G06F 13/00* (2006.01)
(52) U.S. Cl. .......................... 710/317; 370/392
(58) Field of Classification Search .......... 710/316–317, 710/240–241; 370/389, 392, 351, 413
See application file for complete search history.

(56) References Cited

U.S. PATENT DOCUMENTS

| 5,517,186 A | 5/1996 | Veenstra |
| 5,530,814 A | 6/1996 | Wong et al. |
| 5,689,644 A | 11/1997 | Chou et al. |

(Continued)

FOREIGN PATENT DOCUMENTS

EP    0 744 879    11/1996

(Continued)

OTHER PUBLICATIONS

Golshan et al., "A novel reduced swing CMOS BUS interface circuit for high speed low power VLSI systems", *IEEE Explore*, Jan. 22, 2009, pp. 351-354.

(Continued)

*Primary Examiner* — Clifford Knoll
(74) *Attorney, Agent, or Firm* — Nixon & Vanderhye P.C.

(57) ABSTRACT

Crossbar circuitry has data input and output paths, and at each intersection between a data input and output path, a crossbar cell is provided. A transmission circuit is responsive to a stored routing value to couple a data input path to a selected data output path. Pre-selection circuitry cooperates with the pre-selection circuits of other crossbar cells on the same data output path to use the bit lines of the data output path to compare quality-of-service values associated with multiple asserted transmission requests and to determine a subset thereof which have a highest value of the quality-of-service values. Arbitration circuitry implements a predetermined priority scheme to choose from that subset of requests and to cause the configuration storage circuit of only one crossbar cell associated with the same data output path to have its routing value programmed to the first value, thereby resolving conflict between multiple asserted transmission requests.

25 Claims, 11 Drawing Sheets

U.S. PATENT DOCUMENTS

| | | | |
|---|---|---|---|
| 5,781,717 | A | 7/1998 | Wu et al. |
| 5,857,111 | A | 1/1999 | Oda |
| 5,991,296 | A | 11/1999 | Mu et al. |
| 6,125,429 | A | 9/2000 | Goodwin et al. |
| 6,356,111 | B1 | 3/2002 | Moss |
| 6,690,597 | B1 | 2/2004 | Perlov et al. |
| 6,771,162 | B1 | 8/2004 | Moss |
| 6,801,978 | B2 | 10/2004 | Sota |
| 6,950,893 | B2 | 9/2005 | Chan |
| 7,020,131 | B1 | 3/2006 | Yun et al. |
| 7,239,669 | B2 | 7/2007 | Cummings et al. |
| 7,643,493 | B1 | 1/2010 | Sayrafian-Pour |
| 7,657,693 | B2 | 2/2010 | Singh et al. |
| 8,108,585 | B2 | 1/2012 | Satpathy et al. |
| 2004/0047334 | A1 | 3/2004 | Francois et al. |
| 2004/0083326 | A1 | 4/2004 | Wang et al. |
| 2004/0120337 | A1 | 6/2004 | Jun et al. |
| 2010/0090189 | A1 | 4/2010 | Savransky |
| 2010/0211719 | A1 | 8/2010 | Satpathy et al. |
| 2011/0138098 | A1 | 6/2011 | Satpathy et al. |

FOREIGN PATENT DOCUMENTS

| | | |
|---|---|---|
| GB | 2 261 131 | 10/1991 |
| JP | 2000-22728 | 1/2000 |
| JP | 2002-342306 | 11/2002 |
| JP | 2004-78713 | 3/2004 |
| JP | 2008-46997 | 2/2008 |
| WO | WO2005/020066 | 3/2005 |

OTHER PUBLICATIONS

Chang et al., "A 50 Gb/s 32 × 32 CMOS Crossbar Chip using Asymmetric Serial Links", *Computer System Laboratory, Stanford University*, Apr. 1999, (4 pages).

Wu et al., "A 2Gb/s 256 * 256 CMOS Crossbar Switch Fabric Core Design using Pipelined MUX", *IEEE*, Jul. 2002, pp. II-568-II-571.

Wijetunga, "High-performance crossbar design for system-on-chip", $3^{rd}$ *IEEE International Workshop*, Jun. 2003, (6 pages).

Borgatti et al., "A Multi-Context 6.4Gb/s/Channel On-Chip Communication Network Using 0.18μm Flash-EEPROM Switches and Elastic Interconnects", *IEEE International Solid-State Circuits Conference*, Sep. 2003, (3 pages).

Chi et al., "Decomposed Arbiters for Large Crossbars with Multi-Queue Input Buffers", IEEE International Conference on Computer Design, Oct. 14-16, 1991, pp. 233-238.

Delgado-Frias et al., "A VLSI Crossbar Switch with Wrapped Wave Front Arbitration", IEEE Transactions on Circuits and Systems, vol. 50, Issue 1, Jan. 2003, pp. 135-142.

Kavaldjiev et al., "A Virtual Channel Router for On-chip Networks", IEEE International SoC Conference, Sep. 12-15, 2004, pp. 289-293.

Shin et al, "Round-robin Arbiter Design and Generation", International Symposium on System Synthesis, 2002, pp. 243-248.

Molnar et al., "Simple Circuits that Work for Complicated Reasons", International Symposium on Advanced Research in Asynchronous Circuits and Systems, 2000, 12 pages.

Josephs et al., "CMOS Design of the Tree Arbiter Element", IEEE Transactions on VLSI systems, vol. 4, Issue 4, Dec. 1996, pp. 472-476.

Plummer, "Asynchronous Arbiters", IEEE Transactions on Computers Archive, vol. 21, Issue 1, Jan. 1972), pp. 37-42.

UK Search Report dated Apr. 16, 2010 for GB 1000172.5.

"NB9103112: Neural-Network Controller for Large Crosspoint Networks" Mar. 1, 1991, IBM, IBM Technical Disclosure Bulletin, vol. 33, Iss. 10B, pp. 112-116.

"NB9103106: Hierarchical Neural Network-Based Controller for Crosspoint Networks" Mar. 1, 1991, IBM, IBM Technical Disclosure Bulletin, vol. 33, Iss. 10B, pp. 106-109.

A. Marrakchi et al, "A Neural Net Arbitrator for Large Crossbar Packet-Switches" IEEE Transactions on Circuits and Systems, vol. 36, No. 7, Jul. 1989, pp. 1039-1041.

J. Ghosh et al, "Neural Networks for Fast Arbitration and Switching Noise Reduction in Large Crossbars" IEEE Transactions on Circuits and Systems, vol. 38, No. 8, Aug. 1991, pp. 895-904.

Notice of Allowance mailed Mar. 22, 2012 in co-pending U.S. Appl. No. 12/458,511.

CROSSBAR CIRCUITRY FOR APPLYING A PRE-SELECTION PRIOR TO ARBITRATION BETWEEN TRANSMISSION REQUESTS AND METHOD OF OPERATION OF SUCH CROSSBAR CIRCUITRY

This application is a continuation-in-part of U.S. application Ser. No. 12/926,462 filed Nov. 18, 2010, which is a continuation-in-part of U.S. application Ser. No. 12/458,511 filed Jul. 14, 2009, which is a continuation-in-part of U.S. application Ser. No. 12/379,191 filed Feb. 13, 2009, now U.S. Pat. No. 8,108,585 the entire contents of each of which are hereby incorporated by reference.

BACKGROUND OF THE INVENTION

1. Field of the Invention

The present invention relates to crossbar circuitry and a method of operation of such crossbar circuitry.

2. Description of the Prior Art

A crossbar circuit is a switch infrastructure for connecting multiple inputs to multiple outputs in a matrix manner. Accordingly, crossbar circuitry can be used to interconnect a plurality of source circuits and a plurality of destination circuits such that data input to the crossbar circuitry from any of the plurality of source circuits can be output to any of the plurality of destination circuits. Crossbar circuits can be used in a variety of implementations. For example, in a data processing system implementation, such crossbar circuitry can be used to interconnect a plurality of processors used to perform data processing operations on data values with a plurality of memory devices used to store those data values, thereby allowing the data values from any memory device to be routed to any processor.

Known techniques for producing crossbar circuits require a large area for the crossbar circuitry due to the components required to form the crossbar circuitry and the significant number of control lines required for routing control signals to those components, and also consume significant power. Further, their complexity tends to grow rapidly with size, making many of the known techniques impractical for use with crossbar circuits required to interconnect a large number of source circuits with a large number of destination circuits. Some known techniques are discussed below.

The article "A 50 Gb/s 32×32 CMOS Crossbar Chip using Asymmetric Serial Links" by K Chang et al, 1999 Symposium on VLSI Circuits, Digest of Technical Papers, Pages 19 to 22, and the article "A 2 Gb/s 256×256 CMOS Crossbar Switch Fabric Core Design using Pipelined MUX" by T Wu et al, IEEE International Symposium on Circuits and System, 2002, Pages 568 to 571, describe crossbar circuits using a hierarchical arrangement of multiplexers to enable the routing of data from any input source to any output destination. However, such MUX-based crossbar circuits are relatively large in size, and have a large power consumption. Further, they typically require a considerable number of control lines in order to control the various multiplexers. Such MUX-based designs are not typically scalable with an increase in the number of inputs and outputs to be supported, at least in part because it becomes increasingly difficult as the size increases to route the necessary control signals to the various multiplexers. Further, if the input data is multi-bit data routed over an input bus, the routing of the data paths themselves becomes very complex.

The article "A Novel Reduced Swing CMOS Bus Interface Circuit for High Speed Low Power VLSI Systems" by R Golshan et al, IEEE International Symposium on Circuits and System, Pages 351 to 354, 1994, describes an X-Y style crossbar circuit where the input paths pass in a horizontal direction and the output paths pass in a vertical direction. At the intersection between each input path and output path, a storage element in the form of a flip-flop circuit is provided whose output controls a transistor used to couple the input path to the output path. However, such a design requires a large number of control lines to program the various flip-flops in order to configure the crossbar circuit to perform the required routing. Further, the input data provided on an input data path is used to drive the output data on the relevant output data path. As the crossbar circuit becomes larger to accommodate larger numbers of inputs and outputs, the capacitance of the output data paths increases, and accordingly it is necessary to provide larger drive transistors on the inputs in order to overcome the increased capacitance. In addition, the coupling transistor driven by the flip-flop at the interconnection between a data input path and a data output path also needs to increase in size as the crossbar circuit increases in size. Further, it will typically be necessary to include one or more buffers in the data output paths as the crossbar circuitry increases in size. All of these factors give rise to significant problems in layout of the elements of the crossbar circuit and the associated control lines, particularly as the crossbar circuit increases in size to accommodate more inputs and outputs. Accordingly, this approach becomes complex and is not scalable.

The article "High-Performance Crossbar Design for System-On-Chip" by P Wijetunga, Proceedings of the Third IEEE International Workshop on System-On-Chip for Real-Time Applications, 2003, describes a crossbar design employing a pass-transistor chain as transmission circuitry to be located at each intersection between the data input paths and the data output paths. When the pass-transistor chain is required to couple the input data to the output data path, a current sensing circuit located on the output data path is used to detect the input data value. A significant disadvantage of this design is that it consumes large power due to the requirement for current sensing devices to be located on each output path. Further, a large number of control signals need routing within the crossbar circuitry, and indeed those control signals will dominate the routing requirements as the crossbar circuit increases in size to accommodate more inputs and outputs. Hence, again, this design is not readily scalable to larger designs of crossbar circuitry.

The article "A Multi-Context 6.4 Gb/s/Channel On-Chip Communication Network using 0.18 μm Flash-EEPROM Switches and Elastic Interconnects" by M Borgatti et al, ISSCC 2003, Session 26, Embedded and Digital Systems, Paper 26.5, describes a programmable crossbar implemented using a matrix of modified flash-EEPROM devices. However, as is clear from Figure 26.5.6, the number of memory cells involved in routing a data input from a source device to a destination device depends on where those devices are connected into the crossbar, and accordingly the timing for signals passing through the crossbar is not deterministic. Further, a large number of control lines will be required to enable programming of the various flash-EEPROM cells, and a significant amount of time will be required to program those various flash-EEPROM cells. Any reconfiguration of the crossbar device will hence also take a significant time.

Accordingly, such a design of crossbar is complex, and will increase in complexity as more input devices and output devices need to be supported by the crossbar, due to the proliferation in control lines required. Further, since the timing of the crossbar is not deterministic, this will make the crossbar design inappropriate for certain implementations.

In summary, it will be appreciated from the above discussions that existing crossbar designs typically involve complex routing of control signals, with that complexity rapidly increasing as the size of the crossbar increases. Often the designs consume significant power consumption and lack scalability, due partly to the number of control lines required, and partly due to the need to increase the size of certain components provided within the crossbar as the size of the crossbar increases.

Commonly owned US published patent application 2010/0211719, the entire contents of which are hereby incorporated by reference, describes a crossbar circuit design where routing patterns are cached locally at crosspoints in the crossbar and are then used to route data. This significantly reduces routing congestion when producing the wiring layout for the crossbar circuit. The design is readily scalable, and hence the crossbar circuitry can be readily utilised even where the number of source circuits and destination circuits to be connected to the crossbar circuitry is large. Further, the design produces a regular layout providing a fixed latency for the transfer of data through the crossbar circuitry.

Another issue in crossbar design is how to provide the crossbar with collision detection and resolution abilities. Multiple requests for the same destination in a switching fabric is termed a collision. With increasing number of sources and destinations, collisions get more frequent. Under such circumstances, arbitration becomes a bottle-neck in the overall efficiency of the crossbar circuitry.

Most contemporary switching fabrics consist primarily of two modules: a crossbar to transmit data, and an arbiter to configure the crossbar. In such an implementation, the source circuits send requests to the arbiter for channels. The arbiter samples all requests and using some priority assignment scheme, grants some or all of the requests and configures the crossbar accordingly. This scheme poses two major problems for scalability:

1) Routing all request signals from the source circuits to the arbiter, and all the grant signals back, becomes increasingly difficult for larger systems; and
2) The arbiter needs to have knowledge of all incoming requests as well the current state of the crossbar, before it can make a decision. Monitoring the state of the crossbar every cycle requires additional logic as well as interconnects. This contributes to additional delay.

A number of attempts have been made to address the scalability and arbitration delay of packet switching networks. In the article by Chi H. et. al. entitled "Decomposed Arbiters for Large Crossbars with Multi-Queue Input Buffers," IEEE International Conference on Computer Design, 14-16 Oct. 1991, pages: 233-238, the authors discuss decomposing arbiters, so that some requests can be granted before the arbitration process completes. However, the worst case arbitration delay still remains the same. In general, the arbitration delay grows linearly with size.

In the article by Delgado-Frias et. al. entitled "A VLSI Crossbar Switch with Wrapped Wave Front Arbitration," IEEE Transactions on Circuits and Systems, Volume 50, Issue 1, Jan. 2003 Pages: 135-141, and the article by Kavaldjiev N. et. al. entitled "A Virtual Channel Router for On-chip Networks," IEEE International SoC Conference, 12-15 Sep. 2004, pages: 289-293, the authors discuss the handling of arbitration within a crossbar. However, the disclosed implementations are not scalable and are restricted to a crossbar of size 4*4.

In the article by Shin E. et. al. entitled "Round-robin Arbiter Design and Generation," International Symposium on System Synthesis, 2002, pages: 243-248, the authors propose a tool to generate a round robin arbiter. The approach is hierarchical, attempting to make a 32*32 switch out of 4*4 switches.

In the article by William W. Plummer entitled "Asynchronous Arbiters", IEEE Transactions on Computers Archive Volume 21, Issue 1 (January 1972) Pages 37-42, the article by Charles E. Molnar et. al. entitled "Simple Circuits that Work for Complicated Reasons," International Symposium on Advanced Research in Asynchronous Circuits and Systems, 2000. (ASYNC 2000) Proceedings, and the article by Mark B. Josephs et. al. entitled "CMOS Design of the Tree Arbiter Element," IEEE Transactions on VLSI systems, Volume 4, Issue 4, Dec 1996 Page(s):472-476, some asynchronous techniques for arbitration are described. These designs exploit meta-stability to achieve randomness. However, delay in meta-stable systems can become high at times, thereby restricting their use in real time systems that require guaranteed throughput.

In summary, many solutions available in the literature take a hierarchical approach towards making a large crossbar switch using 2*2 or 4*4 switches. Hence, the delay grows linearly with the size of the crossbar switch. This leaves no room for voltage scaling in wide and parallel systems (SIMD/MIMD type applications).

Further, in previous attempts to integrate the arbiter and the crossbar together, such as for example discussed in the earlier mentioned article "A Virtual Channel Router for On-chip Networks," IEEE International SoC Conference, 12-15 Sep. 2004, pages: 289-293, it has only been possible to bring them spatially close. However, the logic and interconnect for both functionalities have remained exclusive.

In conventional implementations, collision detection and resolution is done hierarchically. This is achieved in multiple stages of arbitration logic, wherein after each stage the number of requests is reduced by a certain fraction.

Commonly owned U.S. published patent application US 2010/0211720, the entire contents of which are hereby incorporated by reference, describes a self-arbitrating design of crossbar circuitry that enables a very efficient resolution of conflicts to be performed by applying a predetermined priority scheme, whilst providing a very regular design, with uniform delay across all paths, and which requires significantly less control lines that typical prior art crossbar designs. Such crossbar circuitry is readily scalable to form large crossbars. Further, US 2010/0211720 proposed the use of a priority configuration module which, in a priority assignment mode of operation, is able to reprogram the values in selected priority storage circuits of the crossbar. It is also identified that such a priority configuration module could be made adaptive by monitoring activity of the crossbar and determining how to update the priority storage circuits dependent on that analysis.

Certain types of priority scheme could still be difficult to implement efficiently in the above-described techniques, for example adaptive priority schemes where the relative priorities of the source circuits change between each application of the adaptive priority scheme. This is due to the fact that according to such techniques, it is typically necessary to enter a dedicated priority assignment mode of operation in order to reprogram the priority storage circuits, thereby causing clock cycles to be spent purely performing the priority update process. Furthermore it has also generally only been possible at one time to reprogram the storage circuits of the crossbar cells connected to one data output path. Moreover, for the adaptive priority configuration module, it is necessary first to extract information from the crossbar indicative of the activities of the crossbar, then to analyse that extracted information, and then to input the revised priority data into the crossbar for storage within the relevant priority storage circuits, thereby leading to an inefficient update process.

Commonly owned U.S. published patent application US 2011/0138098, the entire contents of which are hereby incorporated by reference, describes a self-arbitrating crossbar design in which each crossbar cell has priority storage circuitry configured to store priority data which allows the implementation of an adaptive priority scheme, for example based on the least recently granted (LRG) priority scheme. In particular, the priority storage circuitry is configured, between each application of the adaptive priority scheme by arbitration circuitry, to self update the priority data stored therein. This provides a fast and scalable technique for implementing adaptive priority schemes within a crossbar circuit.

However, in addition to the requirement to provide the above described techniques for arbitrating and prioritising between multiple requests for the same destination, it is desirable for interconnect fabrics to support Quality-of-Service (QoS) requests from the source circuits seeking to use the interconnect to transmit data to the destination circuits. Such QoS requests provide a mechanism for a requesting source circuit to associate a relative level of importance with a data transmission request, such that more important requests can be prioritized over less important requests.

Contemporary interconnect fabrics which support such QoS based relative prioritization of requests (typically on a packet-by-packet basis), employ a QoS arbiter in the control path for configuring the network. The design and implementation of these QoS arbiters is a complex task, and in particular the typically employed synthesis and place-and-route design techniques for implementing such a QoS arbiter result in an undesirably high latency, because of significant memory requirements, often in the form of look-up tables. Some approaches have been proposed for enabling asynchronous and self-timed circuit techniques for designing these components with lower latency. The disclosures: "An Asynchronous Low Latency Arbiter for Quality of Service (QoS) Applications", Tomaz Felicijan at al., Proceedings of the 15$^{th}$ International Conference on Microelectronics, ICM 2003; and "New generic GALS NoC architectures with multiple QoS", Zid, M. et al., International Conference on Design and Test of Integrated Systems in Nanoscale Technology, DTIS 2006 are examples of these proposed techniques.

However the currently known techniques for QoS based arbitration which use a synthesis based approach are best suited to interconnects which link together a limited number of source and destination circuits and these techniques do not scale well for large multiplicity systems. Instead, in such more complex systems an approach taken is to provide a network built with a hierarchy of interconnect fabrics. As a result, data packets have to travel through multiple fabrics, which increases latency as well as dissipates additional energy for intermediate data storage. In consequence the area, delay and energy overhead of the fabric becomes a significant factor in such systems.

Accordingly, it would be desirable to provide an improved crossbar design that alleviates the above described problems related to QoS based arbitration.

SUMMARY OF THE INVENTION

Viewed from a first aspect the present invention provides crossbar circuitry for interconnecting a plurality of source circuits and a plurality of destination circuits such that data input to the crossbar circuitry from any of said plurality of source circuits can be output to any of said plurality of destination circuits, the crossbar circuitry comprising: a plurality of data input paths passing through said crossbar circuitry, each data input path being connectable to one of said plurality of source circuits and providing a plurality of word lines; a plurality of data output paths passing through said crossbar circuitry transverse to the plurality of data input paths, each data output path being connectable to one of said plurality of destination circuits and providing a plurality of bitlines; and a crossbar cell associated with each intersection between one of said data input paths and one of said data output paths, each crossbar cell comprising: configuration storage circuitry programmable to store a routing value, the routing value being programmed to a first value to indicate that data input along the word lines of the data input path to the associated intersection is to be output on the bitlines of the data output path at the associated intersection, and the routing value being programmed to a second value to indicate that data input along the word lines of the data input path to the associated intersection is not to be output on the bitlines of the data output path at the associated intersection; transmission circuitry which in a transmission mode of operation is responsive to the routing value having said first value to detect the data input along the word lines of the data input path and to output an indication of that data on the bitlines of the data output path at the associated intersection; and pre-selection circuitry that operates in a pre-selection mode of operation in dependence on a quality-of-service value received by the crossbar cell from the source circuit connected to the data input path of the associated intersection, the quality-of-service value associated with a transmission request asserted by said source circuit to indicate that said source circuit wishes to route data from the data input path to the data output path at the associated intersection, the pre-selection circuitry being arranged to operate in combination with the pre-selection circuitry of other crossbar cells associated with the same data output path to use the bitlines of the data output path to compare quality-of-service values associated with multiple asserted transmission requests for said same data output path and to determine a subset of said multiple asserted transmission requests having a highest value of said quality-of-service values, the crossbar circuitry further comprising arbitration circuitry configured, in an arbitration mode of operation, to perform an arbitration process to detect the presence of multiple asserted transmission requests for said same data output path, and in the event of such multiple asserted transmission requests to implement a predetermined priority scheme to select a winning transmission request from amongst said subset of said multiple asserted transmission requests to cause the configuration storage circuitry of only one crossbar cell associated with said same data output path to have its routing value programmed to said first value, thereby resolving conflict between said multiple asserted transmission requests according to said predetermined priority scheme and allowing said winning transmission request to proceed.

In accordance with the present invention, crossbar cells are associated with each interception between a data input path and a data output path, with each crossbar cell comprising configuration storage circuitry arranged to store a routing value which can be programmed to a first or a second value, and transmission circuitry arranged in a transmission mode of operation to selectively transfer data on the data input path of that crossbar cell to its data output path in dependence on the particular routing value stored. Each crossbar cell further comprises pre-selection circuitry that operates in a pre-selection mode of operation in combination with the pre-selection circuitry of other crossbar cells in order to compare quality-of-service values associated with multiple asserted transmission requests for the same data path in order to determine a subset of those multiple asserted transmission requests which have a highest value of the quality-of-service values. In particular, when multiple transmission requests are asserted for the same data output path, the pre-selection circuitry of the crossbar cells associated with that data output path use the bitlines of the data outlook path to compare the quality-of-service values associated with the multiple transmission requests. Further, it is the use of the bitlines of the data output path which enables the pre-selection circuitry of the crossbar cells to determine a subset of the multiple asserted transmission requests having a highest value of said quality-of-service values.

In addition, the crossbar circuitry further has arbitration circuitry configured, in an arbitration mode of operation, to perform an arbitration process between multiple asserted transmission requests to implement a predetermined priority scheme to select a winning transmission request from the among the subset of those transmission requests determined by the pre selection circuitries of each crossbar cell, such that the conflict between the multiple asserted transmission requests is resolved according to the predetermined priority scheme and only the winning transmission request is allowed to proceed. As an aside it should be appreciated that "subset" is used in the mathematical sense here, since it is possible for all asserted transmission requests to have the same quality-of-service value, in which case arbitration process would select from amongst all asserted transmission requests.

Hence, it can be seen that in accordance with the present invention, in the pre-selection mode of operation, the bitlines of the data output paths are used to compare the quality-of-service values associated with multiple asserted transmission requests for particular data output paths and to determine a subset of the multiple asserted transmission requests which have a highest value of the quality-of-service values. The subsequent arbitration process carried out by the arbitration circuitry in its arbitration mode of operation then selects from amongst only that subset of the multiple asserted transmission requests which have the highest value of the quality-of-service values. This provides a fast and scalable technique for enabling quality-of-service values associated with transmission requests to be compared with one another within the crossbar circuitry. Significantly, this approach lends itself particularly well to being scaled up to large interconnects, yet with little overhead to the interconnect itself and with little performance impact.

By providing pre-selection circuitry within each crossbar cell, a particularly efficient utilisation of routing tracks and silicon space in the chip is achieved. Moreover, the presence of pre-selection circuitry in each crossbar cell on a given data output path enables the use of the bitlines of the data output path to implement the comparison of the quality-of-service values associated with the multiple asserted transmission requests within the structure of the crossbar cells and the bitlines of the data output paths themselves.

In accordance with the present invention, the crossbar circuitry can be laid out in the style of an SRAM array topology, with the crossbar cells being laid out in an array, the data input paths providing word lines, and the data output lines providing bitlines. Such an arrangement allows for a very efficient layout both in terms of size and in terms of the number of interconnects required.

In one embodiment, said quality-of-service value has a value Q selected from n possible values, wherein each of n−1 of said n possible values is associated with a unique bitline of said plurality of bitlines; in said pre-selection mode of operation, said pre-selection circuitry of any crossbar cells associated with the same data output path that receive an asserted transmission request is configured to selectively modify the voltage on the Q−1 bitlines corresponding to Q−1 lower quality-of-service values, whereafter said pre-selection circuitry is configured to sample the voltage on the bitline associated with said quality-of-service value Q to determine if said asserted transmission request forms one of said subset of said multiple asserted transmission requests having said highest value of said quality-of-service values.

Accordingly there are n possible values for the quality-of-service value, of which n−1 of those values are each associated with a unique bitline of the plurality of bitlines. Furthermore, for a given crossbar cell which receives a transmission request with an associated quality-of-service value Q, the pre-selection circuitry within that crossbar cell is arranged to selectively modify the voltage on the Q−1 bitlines corresponding to lower quality-of-service values. In other words, the pre-selection circuitry in that crossbar cell will selectively modify the voltage on those bitlines associated with any lower quality-of-service values than the quality-of-service value associated with the transmission request which that crossbar cell has received. Thereafter, the pre-selection circuitry is configured to sample the voltage on the bitline associated with the quality-of-service value Q which it did receive, to determine if the transmission request it received is one of the members of the subset of multiple asserted transmission requests which have the highest value of the quality-of-service value. By arranging each pre-selection circuitry to modify the voltage on bitlines associated with lower quality of service values and to then sample the voltage on the bitline associated with its own quality of service value, each pre-selection circuitry can determine if any higher quality-of-service value has been asserted in connection with a transmission request received by another pre-selection circuitry, which would then have caused the voltage on its own associated bitline to be modified. Only the bitlines associated with quality-of-service values which are not lower than any asserted quality-of-service values will survive with unmodified voltages and thus it can be determined by each pre-selection circuitry whether its own quality-of-service value is the highest (or one of the equal highest) quality-of-service values asserted.

It will be recognised that the voltage on the bitlines could be modified in various ways to implement the above described technique, but in one embodiment each of the bitlines is precharged to a first voltage level and then during the pre-selection mode of operation the pre-selection circuitry of any crossbar cells associated with the same data output path that receive an asserted transmission request selectively discharge the voltage on said Q−1 bitlines. Hence in such an embodiment, after the bitlines have been precharged, the Q−1 bitlines associated with quality-of-service levels lower than the asserted transmission request received by a given crossbar cell are selectively discharged in order to assert the dominance of the Q level request over any requests at level Q−1 or lower. If a given bitline is subsequently sampled and found to have a voltage at substantially the precharged first voltage level, then it can be determined not to have been discharged and hence be identified as the highest level of request received.

There are a number of ways in which each pre-selection circuitry could sample the voltage on the relevant bitline, but in one embodiment each pre-selection circuitry comprises a sense-amp enabled latch which senses the voltage on the bitline associated with said quality-of-service value Q following the selective discharge operation performed by the arbitration circuitry. The use of a sense-amp enabled latch means that only a relatively small voltage precharge and discharge is necessary for a value to be stored in the latch indicative of whether that bitline has had its voltage modified or not, providing a fast and energy efficient implementation.

In one embodiment, said pre-selection circuitry comprises an n-way multiplexer, n−1 inputs of said n-way multiplexer being connected to a corresponding bitline of said plurality of bitlines, wherein said n-way multiplexer is configured to select the input connected to the $Q^{th}$ bitline. Accordingly, this provides an efficient mechanism for the pre-selection circuitry to sample the voltage on the bitline associated with the quality-of-service value Q by providing a multiplexer with n inputs and using the value Q to determine which of those inputs to output.

In one embodiment, the $n^{th}$ value of said n possible values is associated with a further bitline of said plurality of bitlines, wherein said pre-selection circuitry is configured not to modify the voltage on said further bitline. Accordingly, a bitline in the plurality of bitlines is reserved for the quality of service value n, i.e. the highest possible quality-of-service value. By arranging the pre-selection circuitry to not modify the voltage on this bitline, it is ensured that a corresponding asserted transmission request with the highest possible quality-of-service value will survive the pre-selection process and become one of the subset to which the predetermined priority scheme is applied.

In one embodiment, an $n^{th}$ input of said n-way multiplexer is tied to a static value. Accordingly, in this alternative embodiment the guarantee that a request with the highest level quality-of-service value survives the pre-selection process is achieved by tying the corresponding input of the multiplexer to a static value. For example, where the bitlines are pre-charged to a logical value of one and if discharge will be read with a logical value of 0, this static value can be set as 1.

In one embodiment, said pre-selection circuitry comprises a conversion unit configured to translate a received encoding of said quality-of-service value Q into a linear encoding of said quality-of-service value Q, said linear encoding comprising n−1 bits. It would also of course be possible for the quality-of-service value Q to be received already in a format of n−1 bits, but in this embodiment the received encoding of the quality-of-service value is different, for example being encoded in a more compact format, such as for example a 4-bit binary encoding representing 16 different quality-of-service values, which can then be translated into a linear encoding of 15 bits. Thus the received encoding can be relatively compact, whilst the linear encoding can be more extensive.

In one embodiment, said conversion unit is a thermometer encoder configured to translate said received encoding of said quality-of-service value Q into a thermometer encoding of said quality-of-service value Q. A thermometer encoding, i.e. one in which all of the bits up to the bit position corresponding to the quality-of-service value Q take a particular value, represents a particularly beneficial manner of encoding the quality-of-service value for application to the selective discharge of the bitlines, since the value of the bit at a given bit position in the thermometer encoding indicates whether a corresponding bitline should be discharged or not. It will be appreciated that the thermometer encoding could be chosen to run from left-to-right or from right-to-left and whether "0" or "1" indicates that the corresponding bitline should be discharged is a free choice.

There are a number of ways in which the transmission request can be asserted from the source circuit for the crossbar cells. However, in one embodiment, each data input path provides n word lines; and in the pre-selection mode of operation said quality-of-service value associated with said transmission request asserted by said source circuit is input to the crossbar cell via the n word lines of that same data input path. Hence, in such embodiments, the data input paths are themselves reused in the pre-selection mode of operation for the provision of the quality-of-service values associated with the transmission requests.

The quality-of-service value could be provided on the word lines in a number of ways, but in one embodiment said quality-of-service value is binary encoded and is input to the crossbar circuitry via a subset of the n word lines of that same data input path. Accordingly, by binary encoding the quality-of-service value, only a subset of the n word lines need be used for the provision of this value. It will be appreciated that a "strict subset" is meant in this context, i.e. a set comprising less than all the wordlines. The remaining word lines can, where appropriate, be used, for example, for signalling other information to the crossbar cell.

In one embodiment, in said pre-selection mode of operation, in a separate step to providing said quality-of-service value, said source circuit connected to the data input path of the associated intersection is configured to provide a data output path selection value indicative of which of said plurality of data output paths are requested to handle said transmission request, and said pre-selection circuitry is configured only to operate in combination with the pre-selection circuitry of other crossbar cells associated with the same data output path to use the bitlines of the data output path to compare quality-of-service values associated with multiple asserted transmission requests for said same data output path if said data output path selection value indicates that said data output path is requested to handle said transmission request. Accordingly, whilst in some embodiments a source circuit could issue a transmission request without specifying which data output path it wishes to handle that transmission, in this embodiment the source circuit is provided with a mechanism for indicating to the crossbar cells on its associated data input path which data output path(s) is/are being requested, and hence which crossbar cells should respond to this transmission request. The pre-selection circuitry of the crossbar cells is configured such that only the relevant crossbar cells then participate in the pre-selection process, and thus only those crossbar cells on a given data output path can provide elements of the subset of multiple asserted transmission requests from which the arbitration circuitry then selects the winning transmission.

The data output path selection value could be provided to the crossbar cells in a number of ways, for example by a dedicated communication path, but in one embodiment each data input path provides n word lines; and in said separate step in the pre-selection mode of operation said data output path selection value is input to the crossbar cell via the n word lines of that same data input path.

In one embodiment, each data output path provides a first set of bitlines and a second set of bitlines, and wherein: said transmission circuitry is configured in said transmission mode of operation to output said indication of that data on said first set of bitlines of the data output path at the associated intersection; and said pre-selection circuitry is arranged to use said second set of bitlines of the data output path to compare quality-of-service values associated with multiple asserted transmission requests for said same data output path. Hence, whilst in some embodiments the set of bitlines provided in each data output path for data transmission are reused by the pre-selection circuitry for the above-described comparison of quality-of-service values associated with multiple asserted transmission requests for that data output path, in this embodiment a second set of bitlines are provided in each data output path for the comparison of the quality of service values. Whilst this is more expensive in terms of the number of bitlines that must be provided in each data output path, this embodiment has the advantage that the comparison process can be carried out at least partially simultaneously with data transmission, for example the comparison between quality-of-service values for a next data transmission can be started whilst the actual data transmission of the previous transmission is still being carried out.

In one embodiment, said plurality of source circuits is configured to transmit data to said plurality of destination circuits as a transmission comprising packets of data and said quality-of-service value is defined for each transmission. Packet-wise transmission of data is generally speaking an efficient manner of transmitting data and the association of a quality of service value for each transmission facilitates the administration of that packet-wise data transmission, since the quality-of-service value is then associated with each packet in the transmission. Accordingly it should be understood that the pre-selection and arbitration process is, performed on a transmission basis and once a source has sent all data packets associated with that transmission, the channel is released and that channel can once more participate in the pre-selection and arbitration process.

In one embodiment, each crossbar cell comprises said arbitration circuitry, each said arbitration circuitry configured to operate in combination with the arbitration circuitry of other crossbar cells associated with the same data output path to perform said arbitration process. Hence in such an embodiment, both the arbitration circuitry and the other crossbar functions are integrated together within the crossbar cells. Arbitration circuitry is generally highly logic dominated while the crossbar is generally highly routing dominated, and by bringing these two functions together within the crossbar cells of the crossbar circuitry, a more efficient utilisation of routing tracks and silicon space in the chip is achieved. In addition, the communication overhead traditionally is incurred between the crossbar and the arbitration circuitry is now alleviated.

However in an alternative embodiment, said arbitration circuitry is centralised in said crossbar circuitry, said arbitration circuitry being configured to perform said arbitration process for said crossbar cells. Although the integration of the arbitration circuitry into each crossbar cell is generally preferred for the above described reasons, in some examples a centralised arbitration circuitry for the crossbar circuitry may be preferred, particularly when the interconnect is relatively small.

There are various predetermined priority schemes which could be implemented. For example in one embodiment said arbitration circuitry is configured to implement said predetermined priority scheme on a least-recently-granted basis. In another embodiment said arbitration circuitry is configured to implement said predetermined priority scheme on a round-robin basis. In another embodiment said arbitration circuitry is configured to implement said predetermined priority scheme on a randomized allocation basis. Other schemes or combinations of schemes are of course possible.

In one embodiment said plurality of source circuits are connectable to either end of said plurality of data input paths. In general the selection of which end of the data input paths is connected to the source circuits can be freely chosen. Equally in one embodiment said plurality of destination circuits are connectable to either end of said plurality of data output paths. In general the selection of which end of the data output paths is connected to the destination circuits can be freely chosen.

The crossbar circuitry of embodiments of the present invention may be utilised in a variety of systems. However, according to a second aspect of the present invention, a data processing apparatus is provided comprising: a plurality of memory devices for storing data values; a plurality of processors for performing data processing operations in parallel on multiple of the data values stored in said plurality of memory devices; and crossbar circuitry in accordance with the first aspect of the present invention for routing the data value from any of said plurality of memory devices to any of said plurality of processors.

Viewed from a third aspect the present invention provides crossbar circuitry for interconnecting a plurality of source means and a plurality of destination means such that data input to the crossbar circuitry from any of said plurality of source means can be output to any of said plurality of destination means, the crossbar circuitry comprising: a plurality of data input path means passing through said crossbar circuitry, each data input means for connecting to one of said plurality of source means and providing a plurality of word line means; a plurality of data output path means passing through said crossbar circuitry transverse to the plurality of data input path means, each data output path means for connecting to one of said plurality of destination means and providing a plurality of bitline means; and a crossbar cell means associated with each intersection between one of said data input path means and one of said data output path means, each crossbar cell means comprising: configuration storage means programmable for storing a routing value, the routing value being programmed to a first value to indicate that data input along the word line means of the data input path means to the associated intersection is to be output on the bitline means of the data output path means at the associated intersection, and the routing value being programmed to a second value to indicate that data input along the word line means of the data input path means to the associated intersection is not to be output on the bitline means of the data output path means at the associated intersection; transmission means, which in a transmission mode of operation is responsive to the routing value having said first value, for detecting the data input along the word line means of the data input path means and to output an indication of that data on the bitline means of the data output path means at the associated intersection; and pre-selection means for operating in a pre-selection mode of operation in dependence on a quality-of-service value received by the crossbar cell means from the source means connected to the data input path means of the associated intersection, the quality-of-service value associated with a transmission request asserted by said source means to indicate that said source means wishes to route data from the data input path means to the data output path means at the associated intersection, the pre-selection means being arranged to operate in combination with the pre-selection means of other crossbar cell means associated with the same data output path means to use the bitline means of the data output path means to compare quality-of-service values associated with multiple asserted transmission requests for said same data output path means and to determine a subset of said multiple asserted transmission requests having a highest value of said quality-of-service values, the crossbar circuitry further comprising arbitration means for operating in an arbitration mode of operation to perform an arbitration process to detect the presence of multiple asserted transmission requests for said same data output path means, and in the event of such multiple asserted transmission requests to implement a predetermined priority scheme to select a winning transmission request from amongst said subset of said multiple asserted transmission requests to cause the configuration storage means of only one crossbar cell means associated with said same data output path means to have its routing value programmed to said first value, thereby resolving conflict between said multiple asserted transmission requests according to said predetermined priority scheme and allowing said winning transmission request to proceed.

Viewed from a fourth aspect the present invention provides a method of operating crossbar circuitry to interconnect a plurality of source circuits and a plurality of destination circuits such that data input to the crossbar circuitry from any of said plurality of source circuits can be output to any of said plurality of destination circuits, the crossbar circuitry having a plurality of data input paths passing through said crossbar circuitry, each data input path being connectable to one of said plurality of source circuits and providing a plurality of word lines, and a plurality of data output paths passing through said crossbar circuitry transverse to the plurality of data input paths, each data output path being connectable to one of said plurality of destination circuits and providing a plurality of bitlines, the method comprising the steps of: employing a crossbar cell associated with each intersection between one of said data input paths and one of said data output paths; programming a routing value to be stored in each crossbar cell, the routing value being programmed to a first value to indicate that data input along the word lines of the data input path to the associated intersection is to be output on the bitlines of the data output path at the associated intersection, and the routing value being programmed to a second value to indicate that data input along the word lines of the data input path to the associated intersection is not to be output on the bitlines of the data output path at the associated intersection; in a transmission mode of operation, causing the crossbar cell to be responsive to the routing value having said first value to detect the data input along the word lines of the data input path and to output an indication of that data on the bitlines of the data output path at the associated intersection; in a pre-selection mode of operation, causing pre-selection circuitry in the crossbar cell to operate in dependence on a quality-of-service value received by the crossbar cell from the source circuit connected to the data input path of the associated intersection, the quality-of-service value associated with a transmission request asserted by said source circuit to indicate that said source circuit wishes to route data from the data input path to the data output path at the associated intersection, the pre-selection circuitry operating in combination with the pre-selection circuitry of other crossbar cells associated with the same data output path to use the bitlines of the data output path to compare quality-of-service values associated with multiple asserted transmission requests for said same data output path and to determine a subset of said multiple asserted transmission requests having a highest value of said quality-of-service values; and in an arbitration mode of operation, causing arbitration circuitry in the crossbar circuitry to perform an arbitration process to detect the presence of multiple asserted transmission requests for said same data output path, and in the event of such multiple asserted transmission requests to implement a predetermined priority scheme to select a winning transmission request from amongst said subset of said multiple asserted transmission requests to cause the configuration storage circuitry of only one crossbar cell associated with said same data output path to have its routing value programmed to said first value, thereby resolving conflict between said multiple asserted transmission requests according to said predetermined priority scheme and allowing said winning transmission request to proceed.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
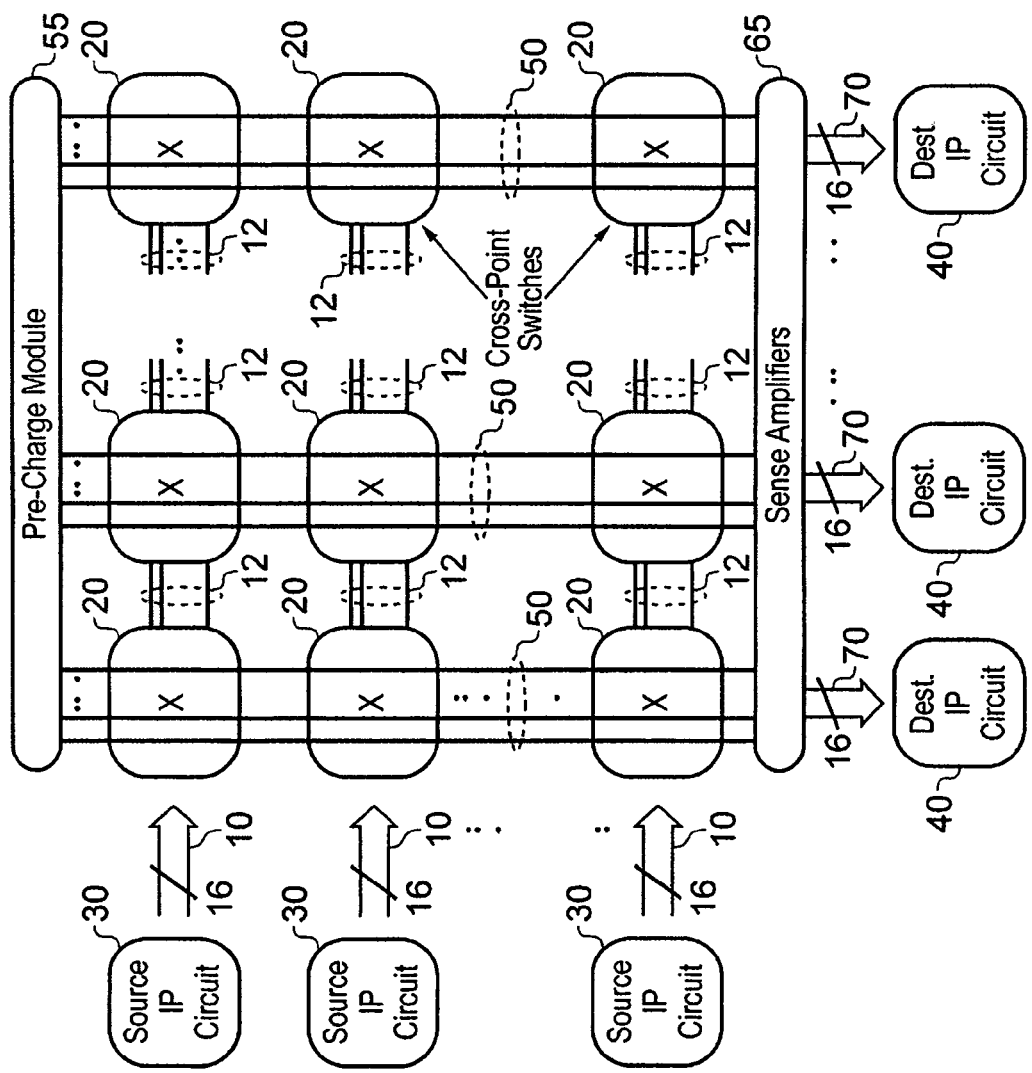
FIG. 1 is a block diagram of crossbar circuitry in accordance with one embodiment.

FIG. 1 illustrates a high-level diagram of a proposed switching fabric, comprising a crossbar circuitry in accordance with one embodiment and a plurality of source circuits and destination circuits connected thereto. The crossbar circuitry includes a plurality of data input paths 12 running in a first direction through the crossbar circuitry, and a plurality of data output paths 50 running in a second direction transverse to the first direction. In the embodiment of FIG. 1, both of these paths are formed by multi-bit buses, and in particular each data input path comprises a plurality of word lines and each data output path comprises a plurality of bitlines. At the intersection between each data input path and data output path, a crossbar cell 20 is provided, which is used to selectively transmit data received from the associated data input path out on the associated data output path. Each crossbar cell includes a configuration storage circuitry for storing the on/off status of each crossbar cell, such that if the crossbar cell is in the on state, then it will route input data received on the data input path to the data output path, and if the cell is in the off state, the input data will merely pass through the cell without being routed onto the associated data output path.

Each data input path 12 is coupled to an associated source circuit 30 from which the input data 10 may be received, and each data output path 50 is coupled to an associated destination circuit 40 arranged to receive the output data 70 provided on the data output path. In the embodiments shown, the bitlines of each data output path 50 are pre-charged using a pre-charge module 55, and then the bitlines are selectively discharged dependant on the data input from one of the source circuits to a crossbar cell connecting that source circuit to the data output path. This selective discharge of the bitlines is detected by the sense amplifier circuitry 65, in order to produce the output data 70.

Whilst data is routed through the crossbar circuitry in the above described manner when the crossbar is in a transmission mode of operation, crossbar circuitry will not always be in a transmission mode of operation. In particular, the crossbar circuitry has an arbitration mode of operation during which it detects and resolves any conflicts between transmission requests issued by the various source circuits 30. In particular, multiple requests for the same destination circuit in a switching fabric is termed a collision, and with increasing numbers of sources and destinations, collisions become more frequent. Furthermore, the crossbar circuitry also has a pre-selection mode of operation during which quality-of-service values which are received by the crossbar cells in association with the transmission requests they receive are compared within a given data output path, such that when multiple transmission requests are asserted for a given data output path, the pre-selection mode of operation can determine a subset of those multiple asserted transmission requests which have the highest value of the quality-of-service values. As will be discussed in more detail later, each crossbar cell 20 includes pre-selection circuitry which, in pre-selection mode of operation, operates in combination with pre-selection circuitry of other crossbar cells on the same data output path, using the bitlines of the data output path to compare the quality of service values associated with multiple asserted transmission requests for the data output path, to determine the above mentioned subset. As mentioned previously, this "subset" is a subset in the mathematical sense, in that in principal all of the multiple asserted transmission requests could have the same quality-of-service value and therefore could all be in the subset. The source circuits are typically arranged to transmit data to the destination circuits as a transmission comprising packets of data, wherein a quality-of-service value is defined for each transmission. Accordingly the pre-selection and arbitration process is performed on a transmission-by-transmission basis and once a source has sent all data packets associated with each transmission, the channel is released and that channel can once more participate in the pre-selection and arbitration process. The proposed approach provides a fast, low-power and highly scalable solution to comparing quality of service values and determining the subset of multiple asserted transmission requests which have the highest value of the quality of service values.

Whilst in FIG. 1 the source circuits are shown to the left hand side of the crossbar and the destinations are shown on the bottom of the crossbar, the source circuits can be provided at either side of the crossbar circuitry, and similarly the destination circuits can be provided at either end of the data output paths. Hence, it will be appreciated that the crossbar circuitry of embodiments of the present invention offers the flexibility of placing sources at either horizontal ends and destinations at either vertical ends. This simplifies design floor planning by reducing routing congestion.

Figure 2:
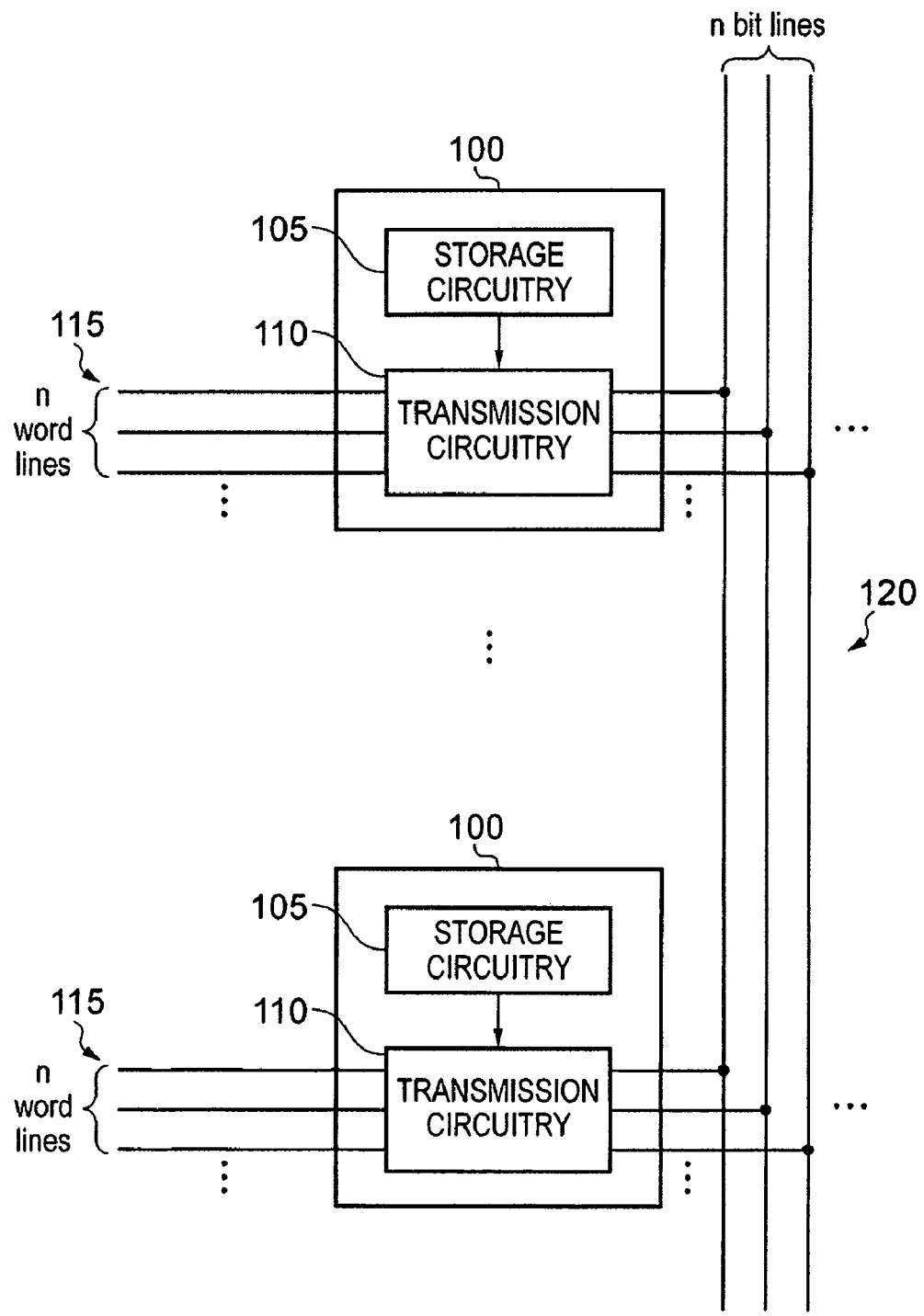
FIG. 2 schematically illustrates how the transmission circuitry in the crossbar cells of one data output path may be arranged in one embodiment.

FIG. 2 schematically illustrates the configuration storage circuitry and transmission circuitry of each crossbar cell in accordance with embodiments of the present invention. Each crossbar cell 100 includes storage circuitry 105 that is programmable to store a routing value (the earlier-mentioned on/off status). During the transmission mode of operation, this routing value is provided from the storage circuitry 105 to the transmission circuitry 110. If the routing value indicates the on status then the transmission circuitry 110 detects the input data received over the n word lines 115, and routes that data out onto the data output path 120. The data is also propagated onto the next crossbar cell (not shown in FIG. 2) along the data input path (such that multicasting/broadcasting of data is possible). If the routing value indicates the off status, then the data is only propagated onto the next crossbar cell (not shown in FIG. 2) along the data input path without being connected to the data output path.

Figure 3:
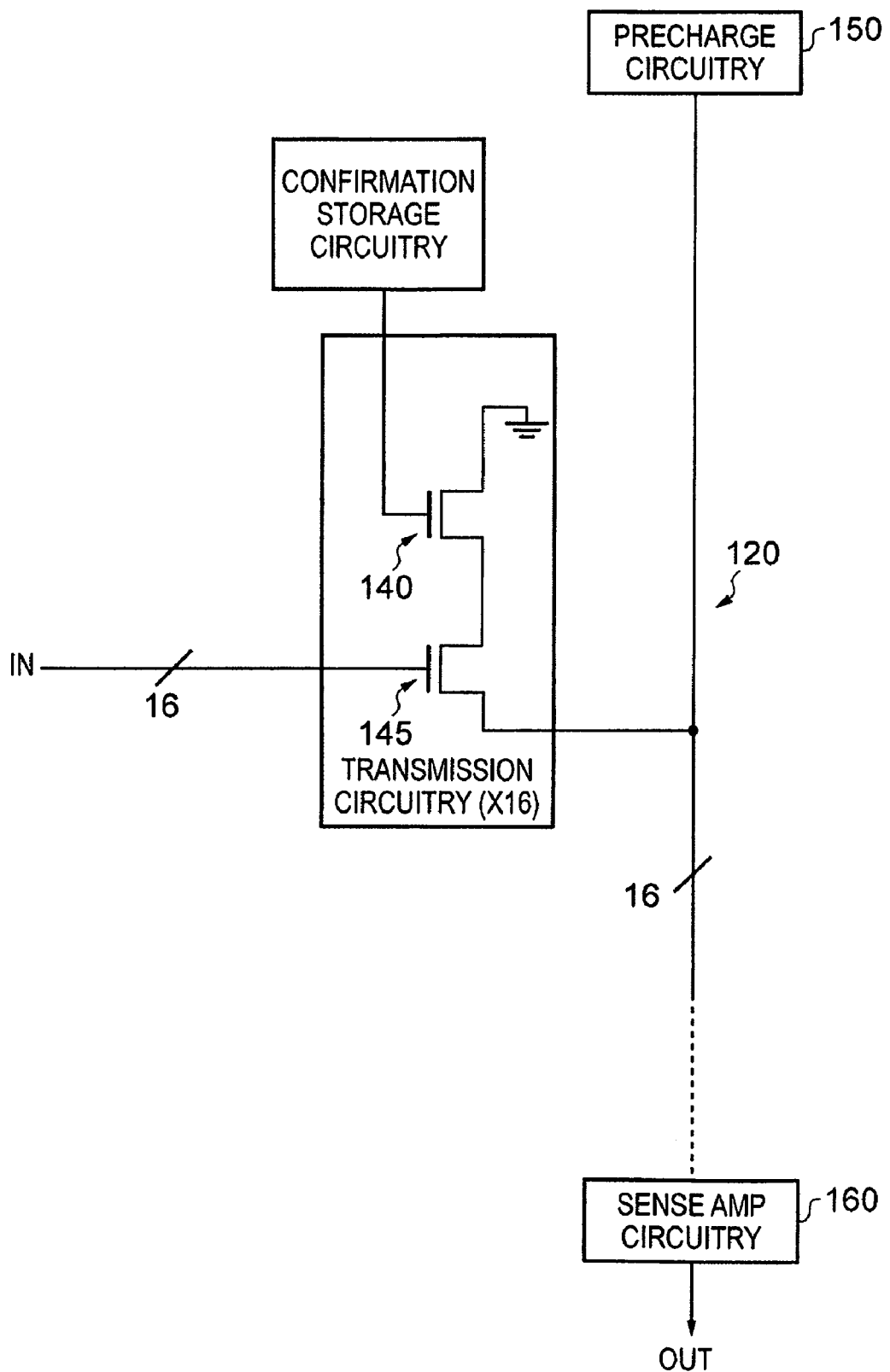
FIG. 3 schematically illustrates in more detail the configuration of the transmission circuitry within a crossbar cell in one embodiment.

FIG. 3 illustrates the structure of the transmission circuitry in each crossbar cell in accordance with one embodiment of the present invention in more detail. In this embodiment, the transmission circuitry includes a pair of transistors 140, 145 for each bit of the data input path. Hence, considering the example of FIG. 1 where the data input path is a 16-bit wide bus, the transistor pairs 140, 145 will be repeated 16 times. In the embodiments shown in FIG. 3, pre charge circuitry 150 is provided for pre charging data output lines of the data output path 120 prior to a transfer of data occurring through a crossbar circuitry. Further, in the embodiments shown in FIG. 3, since amp circuitry 160 is used for sensing the output data.

In the transmission mode of operation, the data output lines 120 are pre-charged to a logical 1 level by the pre charge circuitry 150. Simultaneously, the input data can be provided from the source circuit to the data input paths of the crossbar circuit. Thereafter, the data output lines are conditionally discharged. As can be seen from FIG. 3, a data output line is discharged only if the storage circuitry is in the on state (i.e. stores a logic 1 value thereby turning on transistor 140) and the corresponding input data bit is high thereby turning on transistor 145. Note that accordingly, the data input does not need to drive the data output line 120, since instead the connection to ground discharges the data output line. This is beneficial, since the data output lines can be long, particularly in large crossbar circuits, and accordingly will have significant capacitance. By selectively discharging the bitlines to ground through the transistors 140, 145 when in the on state, this makes the design very scalable, since neither the size of the transmission circuitry, nor the driver circuitry used to provide the input data on the input data path 10, needs to increase in size as the crossbar circuitry increases in size. Further, no additional hardware or sizing is required to support multi-casting, where a single input data value is broadcast to multiple output paths. As also shown in FIG. 3, following the conditional discharge operation, a sensing phase takes place via the sense circuitry 160, where a small variation in the bitline voltage is amplified by the sense amplifier circuitry (for example to a full rail swing). The sense amp circuitry 160 can be constructed in a variety of ways, but in one embodiment is formed by a single ended sense amplifier which compares the voltage on each data output line (bitline) with a reference voltage in order to detect the data output value. In particular, if the data input value on a data input line of the data input path is a logic one value, then this will be detected at the relevant data output path by the sense amp circuitry detecting the voltage on the corresponding data output line dropping below the reference voltage. Conversely if the data input value is a logical 0 value, the transistor 145 will not turn on, and the corresponding data output line will not discharge. Hence, by the end of the sensing phase, the sense amp circuitry will not have detected a drop in the voltage below the reference voltage, and accordingly will determine that the data input value was a logical 0 value.

Figure 4A:
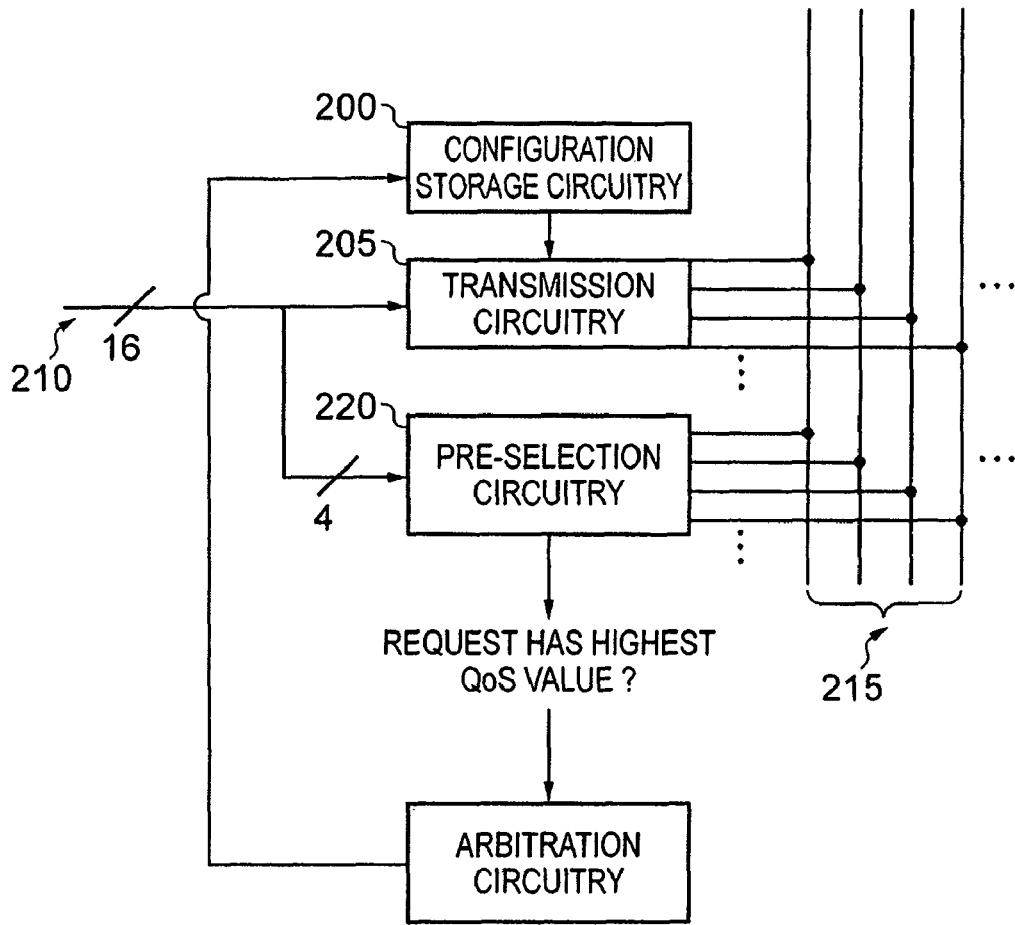
FIGS. 4A and 4B schematically illustrates the circuitry provided within each crossbar cell in two embodiments.

FIG. 4A schematically illustrates the components of a crossbar cell in one embodiment. Configuration storage circuitry 200 and transmission circuitry 205 act as described above with reference to FIGS. 2 and 3 to convey data received on 16-bit data input path 210 onto the data output path 215. The crossbar cell additionally comprises pre-selection circuitry 220 which is coupled between the data input path 210 and the data output path 215. The pre-selective circuitry receives 4 bits from the data input path 210 which are used in a pre-selection mode of operation to indicate a quality-of-service value to the crossbar cell from the source circuit which wishes to use data output path 215. In dependence on the quality of service value received by the pre-selection circuitry 220 the pre-selection circuitry 220 interacts with pre-selection circuitry in other crossbar cells on the same data output path 215 to compare the quality-of-service received by each crossbar cell to determine if the transmission request received by the crossbar cell comprising pre-selection circuitry 220 has the highest quality of service value received by any crossbar cell on data output path 215.

Figure 4B:
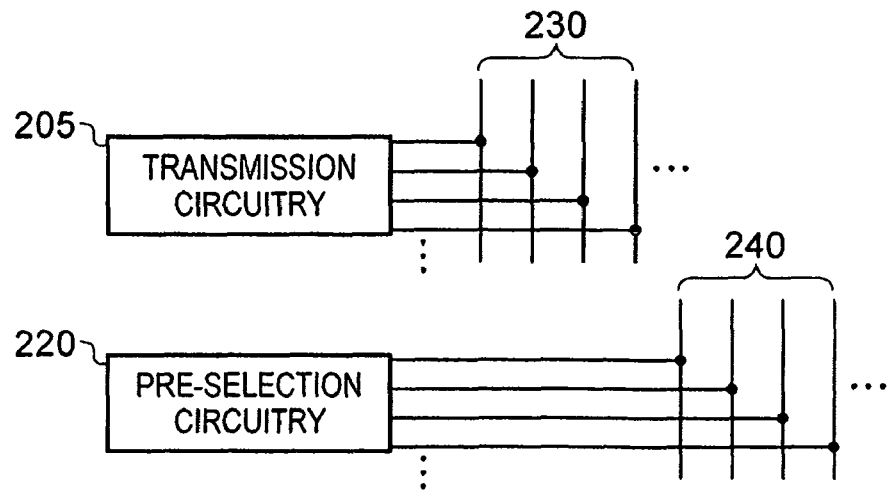

FIG. 4B schematically illustrates a variant on the configuration illustrated in FIG. 4B, wherein a first set of bitlines 230 is used by the transmission circuitry 205 and a second set of bitlines 240 is used by the pre-selection circuitry 220. Thus, whilst in the embodiment shown in FIG. 4A the bitlines 215 provided in each data output path for data transmission are reused by the pre-selection circuitry, in this embodiment a second set of bitlines 240 are provided in each data output path for the comparison of the quality of service values. Whilst this is more expensive in terms of the number of bitlines that must be provided in each data output path, this embodiment has the advantage that the comparison process can be carried out at least partially simultaneously with data transmission, for example the comparison between quality-of-service values for a next data transmission can be started whilst the actual data transmission of the previous transmission is still being carried out.

Figure 5:
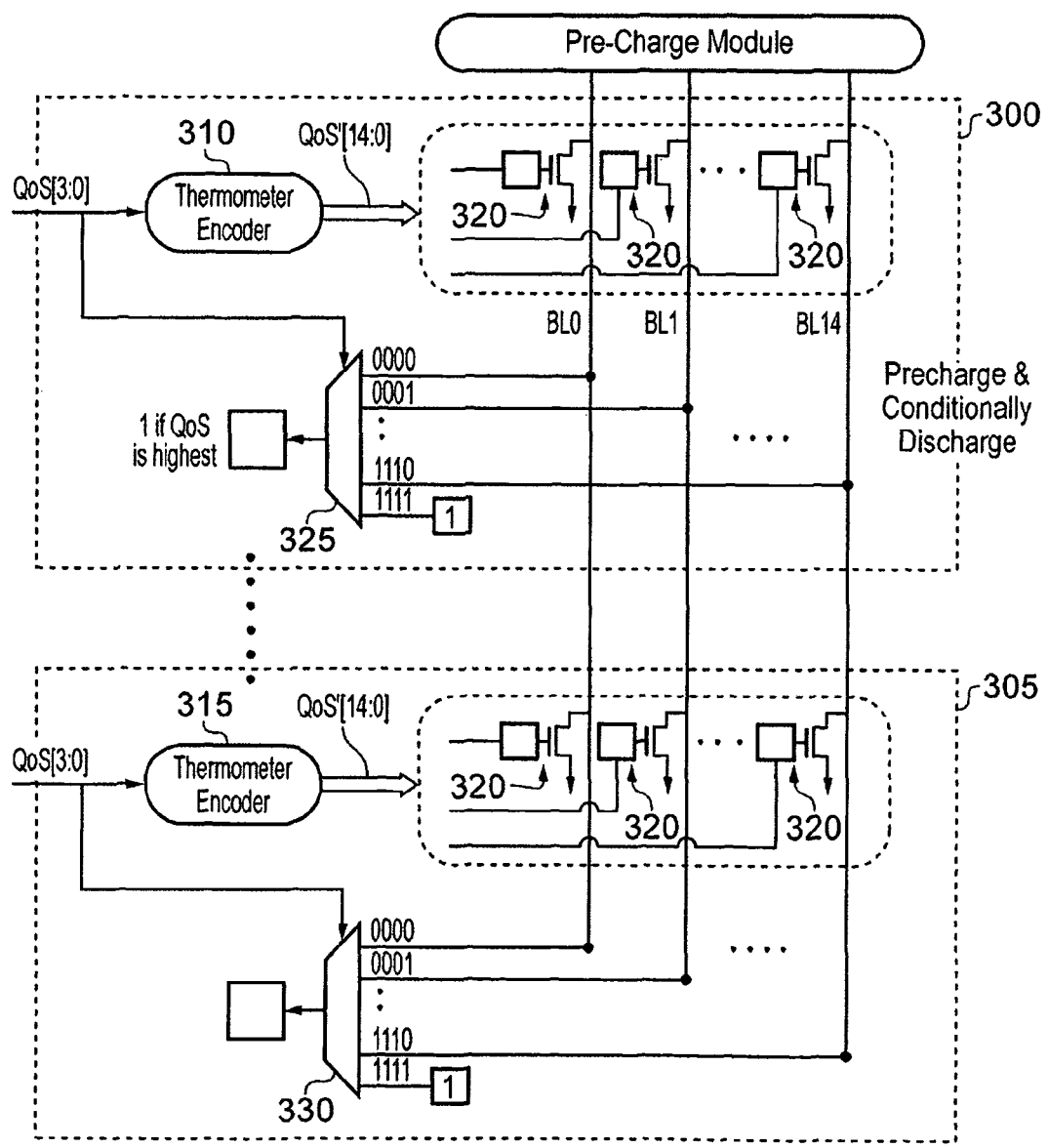
FIG. 5 schematically illustrates in more detail the pre-selection circuitry in each crossbar cell in one embodiment.

FIG. 5 schematically illustrates in more detail the configuration and operation of the pre-selection circuitry in the crossbar cells. FIG. 5 shows the pre-selection circuitry 300, 305 in two crossbar cells on the same data output path. Several intervening pre-selection circuitries are omitted for clarity of illustration. Each pre-selection circuitry 300, 305 is configured to received a quality-of-service (QoS) value indicative of the relative importance of a transmission request being asserted for the data output path by a source circuit. This QoS value may be provided to the pre-selection circuitry via dedicated communication paths or alternatively the input data bus (e.g. the n word lines 115 shown in FIG. 2) may be reused as will be discussed in more detail in the following. In the embodiment shown in FIG. 5, the QoS values received are 4-bit encoded, such that 16 different quality-of-service values can be defined. Each pre-selection circuitry 300, 305 comprises a thermometer encoder 310, 315 respectively which receives the QoS value. The thermometer encoders 310, 315 then convert the binary encoded QoS value into a thermometer encoding representing that QoS value. The thermometer encoding uses 15 bit positions to correspond to each of all but the highest QoS value, wherein the bits up to the bit position corresponding to the QoS value are set. Hence the following thermometer example encodings can be made (but clearly the particular ordering and the choice of meaning of '1' and '0' are arbitrary choices):

| Quality of service value - QoS[3:0] | Thermometer encoding - QoS'[14:0] |
|---|---|
| 4'b 1111 | 15'b 1 1111 1111 1111 |
| 4'b 1110 | 15'b 1 1111 1111 1110 |
| 4'b 1101 | 15'b 1 1111 1111 1100 |
| 4'b 1100 | 15'b 1 1111 1111 1000 |
| ... | ... |

-continued

| Quality of service value - QoS[3:0] | Thermometer encoding - QoS'[14:0] |
|---|---|
| 4'b 0000 | 15'b 0 0000 0000 0000 |

Each of the 15 bit positions which can be set by thermometer encoders 310, 315 in the thermometer encoded QoS' value are coupled to selective discharge transistors 320 which are connected to the bitlines BL0-BL14 of the data output path. The respective bit value at each of the bit positions of the thermometer encoded QoS' value control gates of the selective discharge transistors 320. In this example, a logical value of '0' provided to the corresponding selective discharge transistor 320 causes that transistor to remain off, whereas a logical value '1' supplied to a corresponding selective discharge transistor 320 causes that transistor to couple its bitline to ground, discharging the bitline.

During the pre-selection mode of operation, the pre-charge module pre-charges the bitlines BL0-BL14 and then the thermometer encoded QoS' value causes a selection of the selective discharge transistors 320 to discharge their bitlines. Accordingly, for example if a QoS value of 0 (i.e. 4b'0000) is received by a thermometer encoder, the thermometer encoded QoS' value is generated as a sequence of 15 0's, and none of the selective discharge transistors 320 coupled to that thermometer encoder are caused to discharge their associated bitlines. Alternatively, if a QoS value of 3 (i.e. 4b'0011) is received, the thermometer encoder generates 3 consecutive ones followed by 12 0's. This causes the selective discharge transistors 320 coupled to bitlines BL0, BL1 and BL2 to discharge those bitlines, whilst the remaining bitlines (BL4-BL14) are not discharged. At the other extreme, if the maximum QoS value of 15 is received (i.e. 4b'1111), the thermometer encoder converts this into a thermometer encoded QoS' value of a sequence of 15 1's, which causes all 15 selective discharge transistors 320 in that crossbar cell to discharge all of bitlines BL0-BL14.

Once the selective discharging has been performed, the pre-selection circuitry in each crossbar cell is configured to sample the voltage on the bitline corresponding to the QoS value received. This is implemented by means of multiplexers 325, 330, which are each connected to the bitlines BL0-BL14 via 15 of their inputs. The QoS value received by the pre-selection circuitry is also passed to the selection input of the multiplexer, such that the output of multiplexers 325, 330 is coupled to the bitline corresponding to the QoS value received. For example, a QoS value 0 being received causes bitline BL0 to be coupled to the output of the respective multiplexer, whilst a QoS value of 14 causes bitline BL14 to be coupled to the output of the multiplexer. Multiplexers 325 and 330 have a further input which is permanently tied to a static logical value of 1. This is selected by multiplexer 325, 330 when the highest QoS value of 15 is received.

Accordingly, the pre-selection circuitries 300, 305 provide an arrangement which enables the mutual comparison of the QoS value received by each pre-selection circuitry. This is because each pre-selection circuitry causes all bitlines corresponding to QoS values lower than the QoS value received by that pre-selection circuitry to be discharged. After the discharging has been carried out each pre-selection circuitry is configured to couple the bitline corresponding to the QoS value received by that pre-selection circuitry at the output of its multiplexer. Accordingly, if a given pre-selection circuitry receives the highest QoS value of any pre-selection circuitry in a given data output path, then the bitline corresponding to that QoS value will not be discharged and the pre charged voltage of the bitline can be detected at the output of the multiplexer. On the other hand, if another pre-selection circuitry on the same data output path receives a higher QoS value, then the bitline which corresponds to the QoS value received by the pre-selection circuitry will be discharged by the action of that other pre-selection circuitry and therefore the discharged (i.e. logical 0) voltage of the bitline will be output by the multiplexer.

Figure 6:
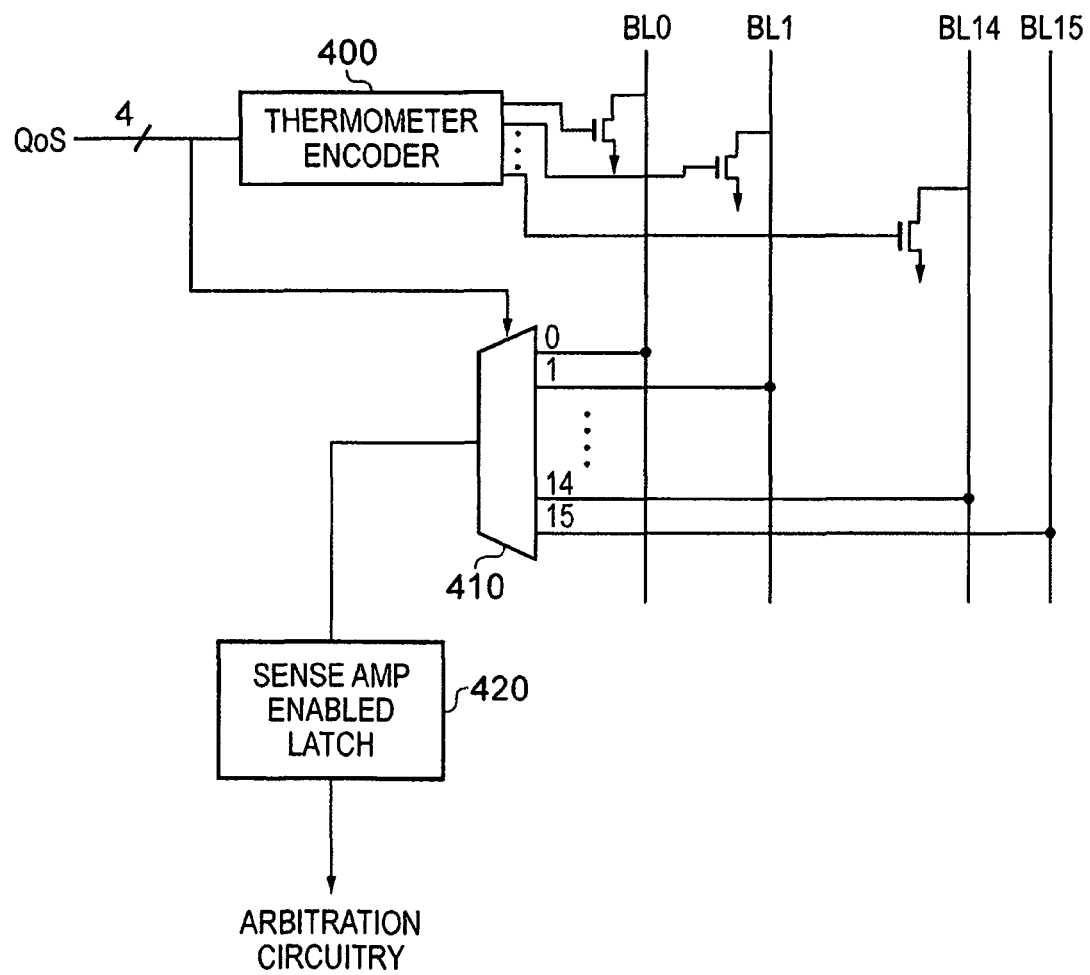
FIG. 6 schematically illustrates the configuration of the pre-selection circuitry in each crossbar cell in one embodiment.

FIG. 6 schematically illustrates the pre-selection circuitry in a crossbar cell in one embodiment, similar to those schematically illustrated in FIG. 5. As in FIG. 5, a 4-bit QoS value is received by the thermometer encoder 400 and is converted into a thermometer encoding which controls the selective discharge of bitlines BL0-BL14, which provide 15 of the inputs to multiplexer 410. However, in the embodiment illustrated in FIG. 6 the $16^{th}$ input to multiplexer 410 (i.e. #15) is coupled to a further bitline BL15. This further bitline BL15 is also pre-charged by the pre-charge circuitry, but does not have a selective discharge transistor coupled to it and therefore cannot be discharged by the action of thermometer encoder 400. Accordingly input #15 into multiplexer 410 will always provide a logical 1 value following the pre-charging of the bitlines. The output of multiplexer 410 is received by sense amp enabled latch 420 which is configured to capture the value read from the appropriate bitline and therefore determine whether the QoS value received by this crossbar cell is the highest (or one of the equal highest) QoS value received on this data output path. An indication of whether this is the case or not is passed to the arbitration circuitry for an arbitration process between any computing requests of equal importance to be carried out. In one embodiment, this arbitration circuitry is provided centrally for the crossbar circuitry, such that the arbitration circuitry can maintain an overview of the entire crossbar circuitry, but in preferred embodiments, such as those illustrated in the following FIGS. 7 and 8, each crossbar cell is provided with its own arbitration circuitry, these arbitration circuitries being configured to cooperate to determine which of these equally important but competing requests should be allowed to proceed on this data output path.

Figure 7:
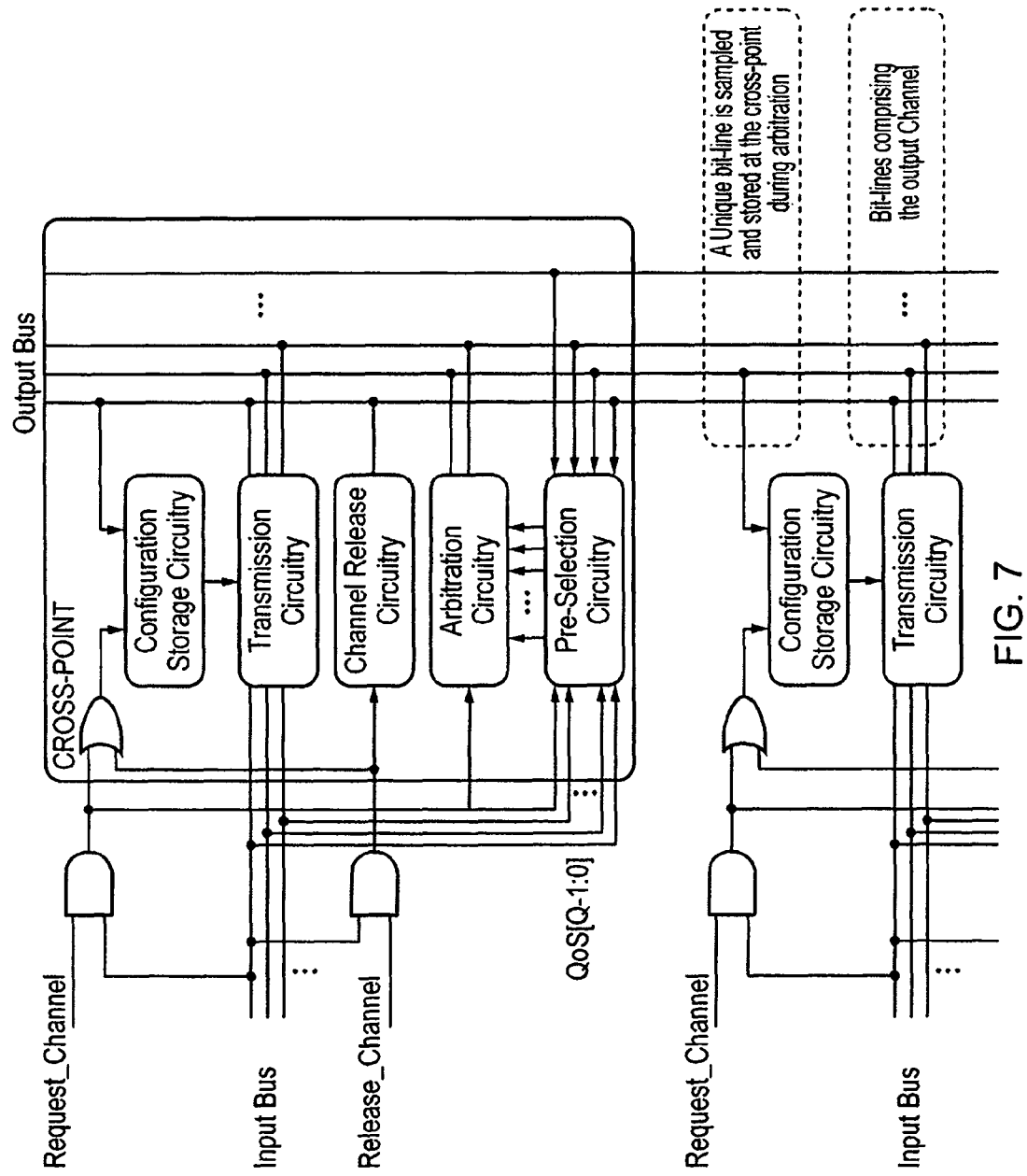
FIG. 7 schematically illustrates more detail of the configuration of the crossbar cells of one data output path in one embodiment.
Figure 7:
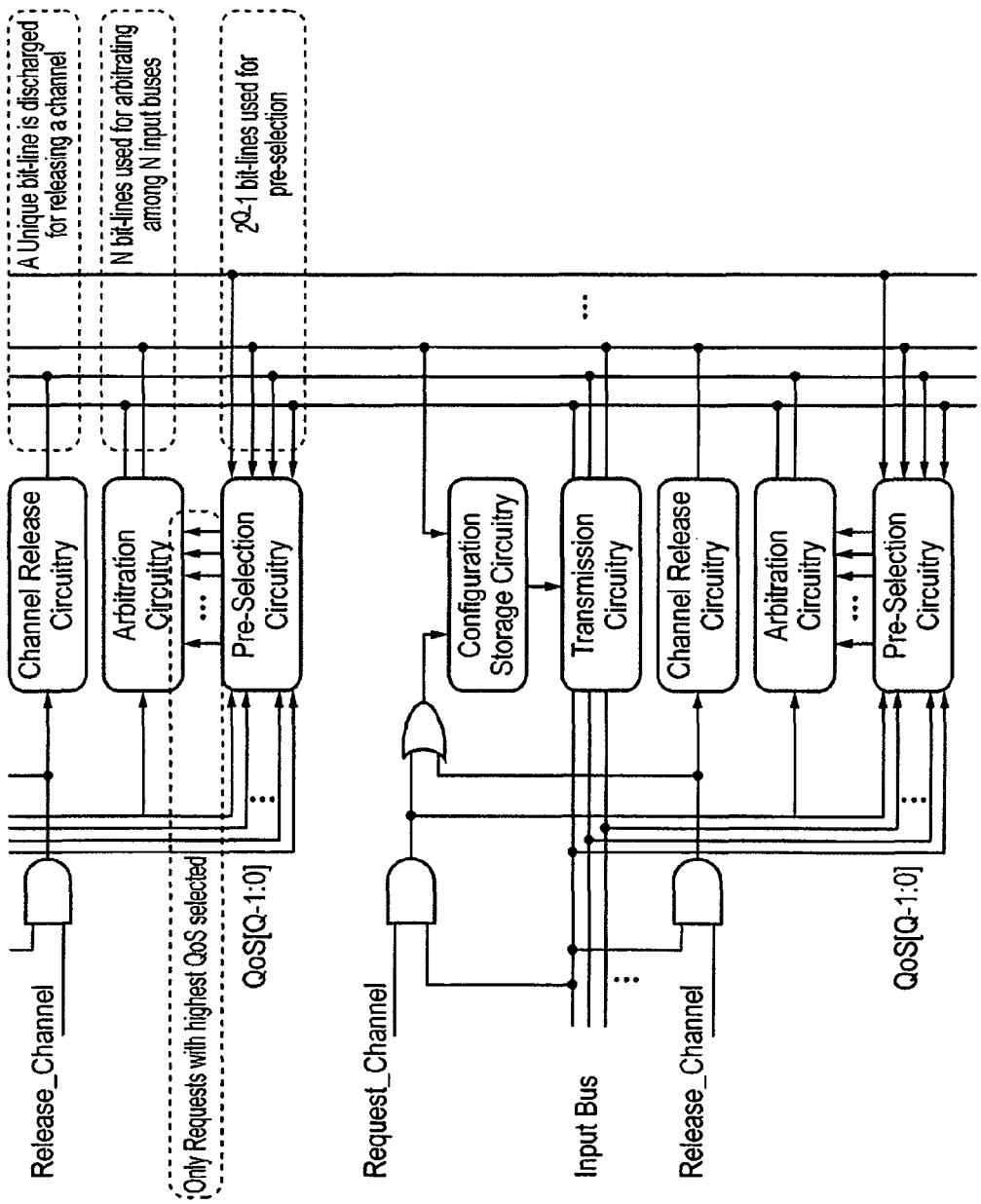
Figure 8:
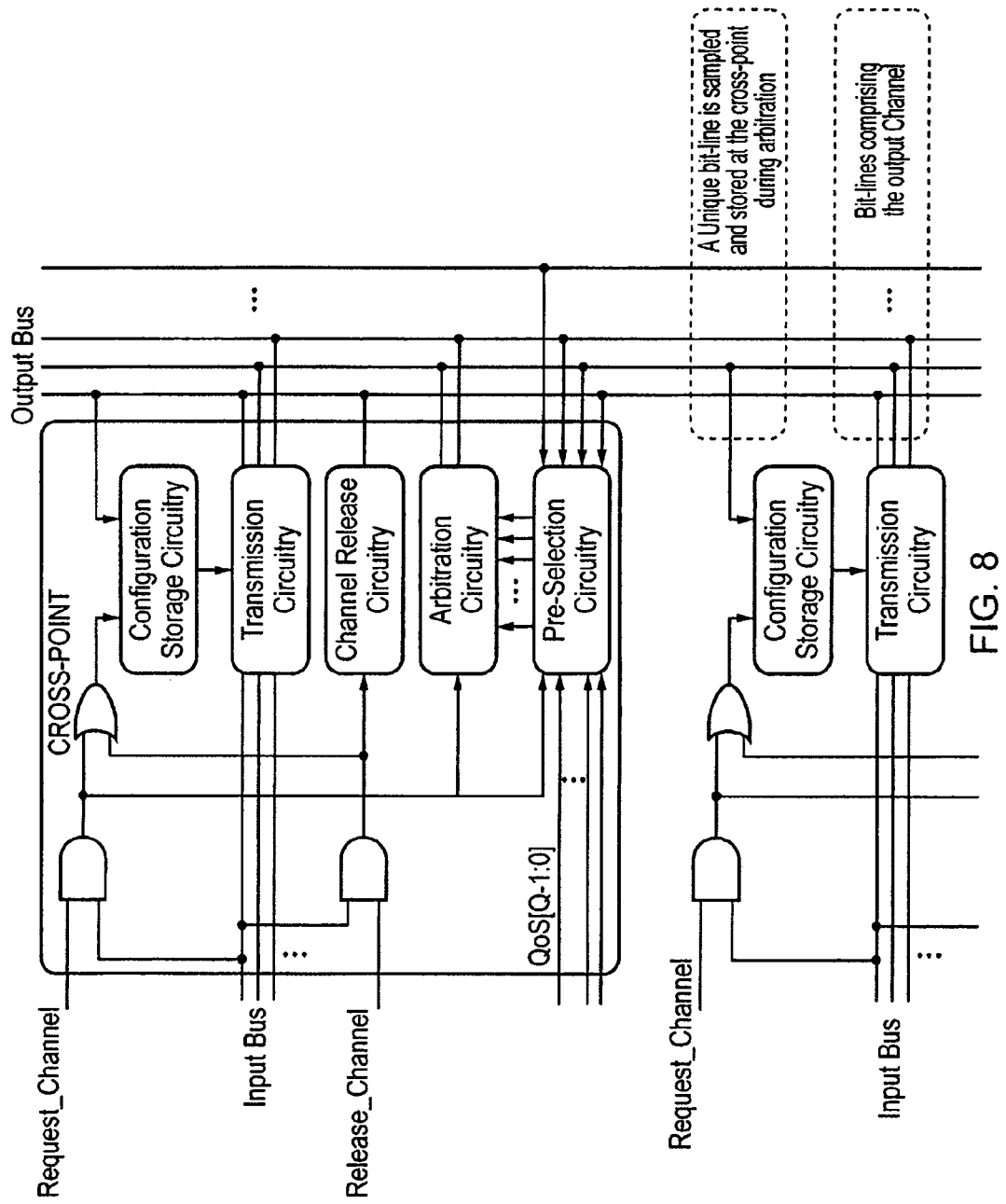
FIG. 8 schematically illustrates more detail of the configuration of the crossbar cells of one data output path in one embodiment.
Figure 8:
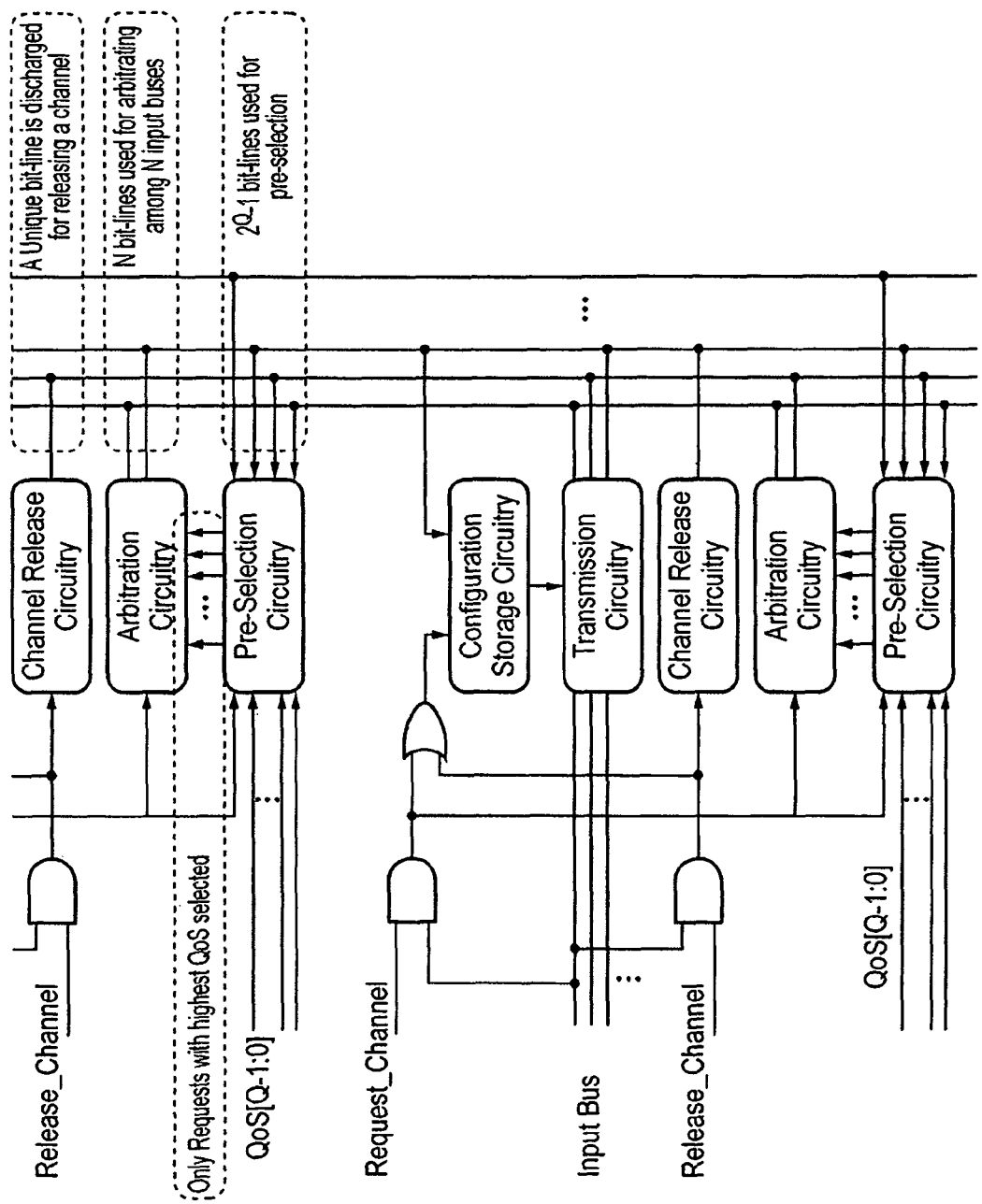

FIGS. 7 and 8 schematically illustrate the interaction between the main components of each crossbar cell in two alternative embodiments. Again, for the purpose of clarity, only a limited number (here 3) of crossbar cells are shown on the illustrated output bus. The arrangement and the interaction of the configuration storage circuitry, transmission circuitry, channel release circuitry and arbitration circuitry have been described in detail in published U.S. published patent application US 2010/0211720 and are not described further here. FIG. 7 illustrates an embodiment in which the input bus is reused to provide the QoS value to the pre-selection circuitry, as described above. This re-use is not necessary however, and FIG. 8 illustrates an example embodiment in which separate signal lines are provided via which the QoS value are passed to the pre-selection circuitry. Whichever method is used to indicate the QoS values to the pre-selection circuitries, following the pre-selection process the pre-selection circuitries indicate to their respective associated arbitration circuitry within that crossbar cell whether or not to participate in the subsequent arbitration process. The arbitration circuitry is configured to discharge N-1 bitlines (as described in detail in U.S. published patent application US 2010/0211720) in order to participate in the arbitration process between the subset of requests. A vector indicating the set of N-1 bitlines for a given arbitration circuitry can either be held within that arbitration circuitry, in which case only a single signal needs to be passed from the pre-selection circuitry to the arbitration circuitry in each crossbar cell (indicating "do participate" or "don't participate"), or (as illustrated in FIGS. 7 and 8), the pre-selection circuitry can indicate that this crossbar cell should participate in the arbitration process by passing this vector to the arbitration circuitry. The pre-selection circuitry can mask out the vector (all-zero) when the crossbar cell should not participate.

Figure 9:
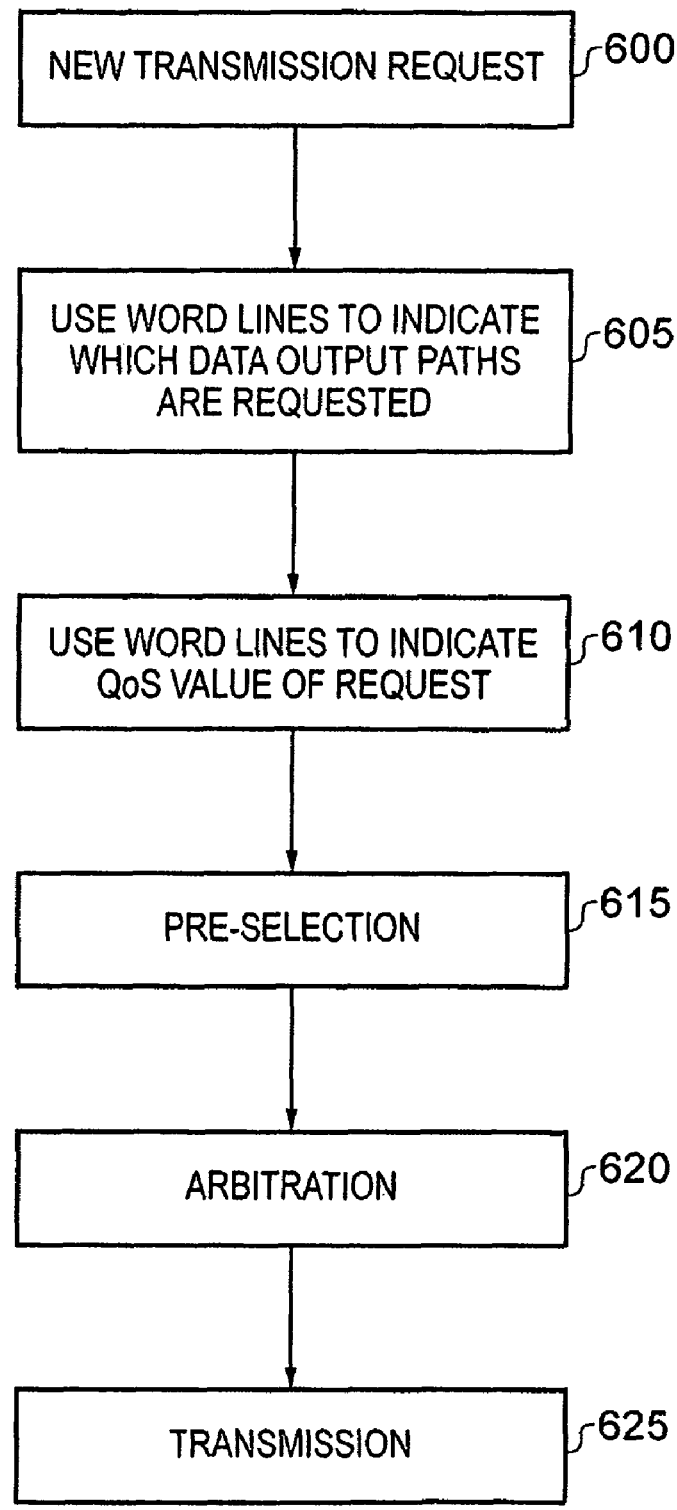
FIG. 9 schematically illustrates a series of steps taken in one embodiment.

FIG. 9 shows a series of steps which can be carried out in the crossbar circuitry in one embodiment when a transmission request is handled. When a new transmission request is handled for a given source circuit (step 600), the first stage (step 605) is for the word lines from that source circuit to be used to indicate which data output paths are being requested. Accordingly, the crossbar cells which are coupled to this source circuit are arranged to capture a value from the word lines in this data output path selection stage, which indicates to each crossbar cell if it should even participate in any of the following steps. Then the pre-selection process described in more detail above is carried out (steps 610 and 615) in order to determine a subset of the competing requests which are seeking to use a given output path. The subsequent arbitration process (step 620) is then carried out only amongst those requests which are pre-selected and the winning transmission request is allowed to proceed at step 625.

In overall summary, crossbar circuitry, and a method of operation of such crossbar circuitry, are provided. The crossbar circuitry has an array of data input paths and data output paths where the data output paths are transverse to the data input paths. At each intersection between a data input path and a data output path, a crossbar cell is provided that comprises a configuration storage circuit programmable to store a routing value, a transmission circuit, and a pre-selection circuit. In a transmission mode of operation, the transmission circuit is responsive to the routing value being a first value, indicating that the data input path should be coupled to the data output path, to detect the data input along the data input path, and to output an indication of that data on the data output path at the associated intersection. In a pre-selection mode of operation, the pre-selection circuitry is operable in the presence of an asserted transmission request from the associated source circuit to operate in combination with the pre-selection circuits of other crossbar cells associated with the same data output path to use the bit lines of the data output path to compare quality-of-service values associated with multiple asserted transmission requests for the same data output path. In the event of such multiple asserted transmission requests, the pre-selection circuitry operates in combination with the other pre-selection circuits to determine a subset of the multiple asserted transmission requests which have a highest value of the quality-of-service values. The crossbar circuitry has arbitration circuitry which, in an arbitration mode of operation implements a predetermined priority scheme to choose from the subset of the multiple asserted transmission requests and to cause the configuration storage circuit of only one crossbar cell associated with the same data output path to have its routing value programmed to the first value, thereby resolving conflict between the multiple asserted transmission requests according to the predetermined priority scheme. Such a construction of crossbar circuitry enables a very efficient resolution of conflicts to be performed, whilst providing a very regular design, with uniform delay across all paths, and which requires significantly less control lines than typical prior art crossbar designs. Such crossbar circuitry is readily scalable to form large crossbars.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Crossbar circuitry for interconnecting a plurality of source circuits and a plurality of destination circuits such that data input to the crossbar circuitry from any of said plurality of source circuits can be output to any of said plurality of destination circuits, the crossbar circuitry comprising:
a plurality of data input paths passing through said crossbar circuitry, each data input path being connectable to one of said plurality of source circuits and providing a plurality of word lines;
a plurality of data output paths passing through said crossbar circuitry transverse to the plurality of data input paths, each data output path being connectable to one of said plurality of destination circuits and providing a plurality of bitlines; and
a crossbar cell associated with each intersection between one of said data input paths and one of said data output paths, each crossbar cell comprising:
configuration storage circuitry programmable to store a routing value, the routing value being programmed to a first value to indicate that data input along the word lines of the data input path to the associated intersection is to be output on the bitlines of the data output path at the associated intersection, and the routing value being programmed to a second value to indicate that data input along the word lines of the data input path to the associated intersection is not to be output on the bitlines of the data output path at the associated intersection;
transmission circuitry which in a transmission mode of operation is responsive to the routing value having said first value to detect the data input along the word lines of the data input path and to output an indication of that data on the bitlines of the data output path at the associated intersection; and
pre-selection circuitry that operates in a pre-selection mode of operation in dependence on a quality-of-service value received by the crossbar cell from the source circuit connected to the data input path of the associated intersection, the quality-of-service value associated with a transmission request asserted by said source circuit to indicate that said source circuit wishes to route data from the data input path to the data output path at the associated intersection, the pre-selection circuitry being arranged to operate in combination with the pre-selection circuitry of other crossbar cells associated with the same data output path to use the bitlines of the data output path to compare quality-of-service values associated with multiple asserted transmission requests for said same data output path and to determine a subset of said multiple asserted transmission requests having a highest value of said quality-of-service values,
the crossbar circuitry further comprising arbitration circuitry configured, in an arbitration mode of operation, to perform an arbitration process to detect the presence of multiple asserted transmission requests for said same data output path, and in the event of such multiple asserted transmission requests to implement a predetermined priority scheme to select a winning transmission request from amongst said subset of said multiple asserted transmission requests to cause the configuration storage circuitry of only one crossbar cell associated with said same data output path to have its routing value programmed to said first value, thereby resolving conflict between said multiple asserted transmission requests according to said predetermined priority scheme and allowing said winning transmission request to proceed.

2. Crossbar circuitry as claimed in claim 1, wherein:
said quality-of-service value has a value Q selected from n possible values, wherein each of n−1 of said n possible values is associated with a unique bitline of said plurality of bitlines;
in said pre-selection mode of operation, said pre-selection circuitry of any crossbar cells associated with the same data output path that receive an asserted transmission request is configured to selectively modify the voltage on the Q−1 bitlines corresponding to Q−1 lower quality-of-service values,
whereafter said pre-selection circuitry is configured to sample the voltage on the bitline associated with said quality-of-service value Q to determine if said asserted transmission request forms one of said subset of said multiple asserted transmission requests having said highest value of said quality-of-service values.

3. Crossbar circuitry as claimed in claim 2, wherein:
each of the bitlines are precharged to a first voltage level and then during the pre-selection mode of operation the pre-selection circuitry of any crossbar cells associated with the same data output path that receive an asserted transmission request selectively discharge the voltage on said Q−1 bitlines.

4. Crossbar circuitry as claimed in claim 3, wherein each pre-selection circuitry comprises a sense-amp enabled latch which senses the voltage on the bitline associated with said quality-of-service value Q following the selective discharge operation performed by the arbitration circuitry.

5. Crossbar circuitry as claimed in claim 2, wherein:
said pre-selection circuitry comprises an n-way multiplexer, n−1 inputs of said n-way multiplexer being connected to a corresponding bitline of said plurality of bitlines,
wherein said n-way multiplexer is configured to select the input connected to the $Q^{th}$ bitline.

6. Crossbar circuitry as claimed in claim 2, wherein the $n^{th}$ value of said n possible values is associated with a further bitline of said plurality of bitlines, wherein said pre-selection circuitry is configured not to modify the voltage on said further bitline.

7. Crossbar circuitry as claimed in claim 5, wherein an $n^{th}$ input of said n-way multiplexer is tied to a static value.

8. Crossbar circuitry as claimed in claim 2, wherein:
said pre-selection circuitry comprises a conversion unit configured to translate a received encoding of said quality-of-service value Q into a linear encoding of said quality-of-service value Q, said linear encoding comprising n−1 bits.

9. Crossbar circuitry as claimed in claim 8, wherein:
said conversion unit is a thermometer encoder configured to translate said received encoding of said quality-of-service value Q into a thermometer encoding of said quality-of-service value Q.

10. Crossbar circuitry as claimed in claim 1, wherein:
each data input path provides n word lines; and
in the pre-selection mode of operation said quality-of-service value associated with said transmission request asserted by said source circuit is input to the crossbar cell via the n word lines of that same data input path.

11. Crossbar circuitry as claimed in claim 10, wherein:
said quality-of-service value is binary encoded and is input to the crossbar circuitry via a subset of the n word lines of that same data input path.

12. Crossbar circuitry as claimed in claim 1, wherein:
in said pre-selection mode of operation, in a separate step to providing said quality-of-service value, said source circuit connected to the data input path of the associated intersection is configured to provide a data output path selection value indicative of which of said plurality of data output paths are requested to handle said transmission request,
and said pre-selection circuitry is configured only to operate in combination with the pre-selection circuitry of other crossbar cells associated with the same data output path to use the bitlines of the data output path to compare quality-of-service values associated with multiple asserted transmission requests for said same data output path if said data output path selection value indicates that said data output path is requested to handle said transmission request.

13. Crossbar circuitry as claimed in claim 12, wherein:
each data input path provides n word lines; and
in said separate step in the pre-selection mode of operation said data output path selection value is input to the crossbar cell via the n word lines of that same data input path.

14. Crossbar circuitry as claimed in claim 1, wherein each data output path provides a first set of bitlines and a second set of bitlines, and wherein:
said transmission circuitry is configured in said transmission mode of operation to output said indication of that data on said first set of bitlines of the data output path at the associated intersection; and
said pre-selection circuitry is arranged to use said second set of bitlines of the data output path to compare quality-of-service values associated with multiple asserted transmission requests for said same data output path.

15. Crossbar circuitry as claimed in claim 1, wherein said plurality of source circuits is configured to transmit data to said plurality of destination circuits as a transmission comprising packets of data and said quality-of-service value is defined for each transmission.

16. Crossbar circuitry as claimed in claim 1, wherein each crossbar cell comprises said arbitration circuitry, each said arbitration circuitry configured to operate in combination with the arbitration circuitry of other crossbar cells associated with the same data output path to perform said arbitration process.

17. Crossbar circuitry as claimed in claim 1, wherein said arbitration circuitry is centralised in said crossbar circuitry, said arbitration circuitry being configured to perform said arbitration process for said crossbar cells.

18. Crossbar circuitry as claimed in claim 1, wherein said arbitration circuitry is configured to implement said predetermined priority scheme on a least-recently-granted basis.

19. Crossbar circuitry as claimed in claim 1, wherein said arbitration circuitry is configured to implement said predetermined priority scheme on a round-robin basis.

20. Crossbar circuitry as claimed in claim 1, wherein said arbitration circuitry is configured to implement said predetermined priority scheme on a randomized allocation basis.

21. Crossbar circuitry as claimed in claim 1, wherein said plurality of source circuits are connectable to either end of said plurality of data input paths.

22. Crossbar circuitry as claimed in claim 1, wherein said plurality of destination circuits are connectable to either end of said plurality of data output paths.

23. A data processing apparatus comprising:
a plurality of memory devices for storing data values;
a plurality of processors for performing data processing operations in parallel on multiple of the data values stored in said plurality of memory devices; and
crossbar circuitry as claimed in claim 1 for routing the data value from any of said plurality of memory devices to any of said plurality of processors.

24. Crossbar circuitry for interconnecting a plurality of source means and a plurality of destination means such that data input to the crossbar circuitry from any of said plurality of source means can be output to any of said plurality of destination means, the crossbar circuitry comprising:
a plurality of data input path means passing through said crossbar circuitry, each data input means for connecting to one of said plurality of source means and providing a plurality of word line means;
a plurality of data output path means passing through said crossbar circuitry transverse to the plurality of data input path means, each data output path means for connecting to one of said plurality of destination means and providing a plurality of bitline means; and
a crossbar cell means associated with each intersection between one of said data input path means and one of said data output path means, each crossbar cell means comprising:
configuration storage means programmable for storing a routing value, the routing value being programmed to a first value to indicate that data input along the word line means of the data input path means to the associated intersection is to be output on the bitline means of the data output path means at the associated intersection, and the routing value being programmed to a second value to indicate that data input along the word line means of the data input path means to the associated intersection is not to be output on the bitline means of the data output path means at the associated intersection;
transmission means, which in a transmission mode of operation is responsive to the routing value having said first value, for detecting the data input along the word line means of the data input path means and to output an indication of that data on the bitline means of the data output path means at the associated intersection; and
pre-selection means for operating in a pre-selection mode of operation in dependence on a quality-of-service value received by the crossbar cell means from the source means connected to the data input path means of the associated intersection, the quality-of-service value associated with a transmission request asserted by said source means to indicate that said source means wishes to route data from the data input path means to the data output path means at the associated intersection, the pre-selection means being arranged to operate in combination with the pre-selection means of other crossbar cell means associated with the same data output path means to use the bitline means of the data output path means to compare quality-of-service values associated with multiple asserted transmission requests for said same data output path means and to determine a subset of said multiple asserted transmission requests having a highest value of said quality-of-service values, the crossbar circuitry further comprising arbitration means for operating in an arbitration mode of operation to perform an arbitration process to detect the presence of multiple asserted transmission requests for said same data output path means, and in the event of such multiple asserted transmission requests to implement a predetermined priority scheme to select a winning transmission request from amongst said subset of said multiple asserted transmission requests to cause the configuration storage means of only one crossbar cell means associated with said same data output path means to have its routing value programmed to said first value, thereby resolving conflict between said multiple asserted transmission requests according to said predetermined priority scheme and allowing said winning transmission request to proceed.

25. A method of operating crossbar circuitry to interconnect a plurality of source circuits and a plurality of destination circuits such that data input to the crossbar circuitry from any of said plurality of source circuits can be output to any of said plurality of destination circuits, the crossbar circuitry having a plurality of data input paths passing through said crossbar circuitry, each data input path being connectable to one of said plurality of source circuits and providing a plurality of word lines, and a plurality of data output paths passing through said crossbar circuitry transverse to the plurality of data input paths, each data output path being connectable to one of said plurality of destination circuits and providing a plurality of bitlines, the method comprising the steps of:

employing a crossbar cell associated with each intersection between one of said data input paths and one of said data output paths;

programming a routing value to be stored in each crossbar cell, the routing value being programmed to a first value to indicate that data input along the word lines of the data input path to the associated intersection is to be output on the bitlines of the data output path at the associated intersection, and the routing value being programmed to a second value to indicate that data input along the word lines of the data input path to the associated intersection is not to be output on the bitlines of the data output path at the associated intersection;

in a transmission mode of operation, causing the crossbar cell to be responsive to the routing value having said first value to detect the data input along the word lines of the data input path and to output an indication of that data on the bitlines of the data output path at the associated intersection;

in a pre-selection mode of operation, causing pre-selection circuitry in the crossbar cell to operate in dependence on a quality-of-service value received by the crossbar cell from the source circuit connected to the data input path of the associated intersection, the quality-of-service value associated with a transmission request asserted by said source circuit to indicate that said source circuit wishes to route data from the data input path to the data output path at the associated intersection, the pre-selection circuitry operating in combination with the pre-selection circuitry of other crossbar cells associated with the same data output path to use the bitlines of the data output path to compare quality-of-service values associated with multiple asserted transmission requests for said same data output path and to determine a subset of said multiple asserted transmission requests having a highest value of said quality-of-service values; and in an arbitration mode of operation, causing arbitration circuitry in the crossbar circuitry to perform an arbitration process to detect the presence of multiple asserted transmission requests for said same data output path, and in the event of such multiple asserted transmission requests to implement a predetermined priority scheme to select a winning transmission request from amongst said subset of said multiple asserted transmission requests to cause the configuration storage circuitry of only one crossbar cell associated with said same data output path to have its routing value programmed to said first value, thereby resolving conflict between said multiple asserted transmission requests according to said predetermined priority scheme and allowing said winning transmission request to proceed.

* * * * *